(12) United States Patent
Fujisaki et al.

(10) Patent No.: US 10,794,966 B2
(45) Date of Patent: Oct. 6, 2020

(54) INFORMATION PROCESSING DEVICE, CLOSED MAGNETIC CIRCUIT COMPUTING METHOD, AND CLOSED MAGNETIC CIRCUIT COMPUTING SYSTEM

(71) Applicant: FUJITSU LIMITED, Kawasaki-shi, Kanagawa (JP)

(72) Inventors: Jun Fujisaki, Kawasaki (JP); Atsushi Furuya, Yokohama (JP); Hideyuki Shitara, Toda (JP)

(73) Assignee: FUJITSU LIMITED, Kawasaki (JP)

( * ) Notice: Subject to any disclaimer, the term of this patent is extended or adjusted under 35 U.S.C. 154(b) by 13 days.

(21) Appl. No.: 16/394,012

(22) Filed: Apr. 25, 2019

(65) Prior Publication Data

US 2019/0377033 A1 Dec. 12, 2019

(30) Foreign Application Priority Data

Jun. 12, 2018 (JP) ................. 2018-112073

(51) Int. Cl.
*G01R 33/00* (2006.01)
*G01R 33/038* (2006.01)

(52) U.S. Cl.
CPC ..... *G01R 33/0023* (2013.01); *G01R 33/0385* (2013.01)

(58) Field of Classification Search
CPC .............. G01R 33/038; G01R 33/0385; G01R 33/0023; H01L 43/10; G01L 1/125; G01N 2035/00237

USPC ......... 324/200, 205, 207.11–207.14, 207.22, 324/211, 76.11, 146, 151 R
See application file for complete search history.

(56) References Cited

U.S. PATENT DOCUMENTS

| 9,354,284 B2 * | 5/2016 | Latham ................ G01R 33/096 |
| 2014/0253114 A1 * | 9/2014 | Khamesee ............ G01R 33/07 324/251 |

FOREIGN PATENT DOCUMENTS

JP 8-201494 8/1996

\* cited by examiner

*Primary Examiner* — Vincent Q Nguyen
*Assistant Examiner* — Trung Nguyen
(74) *Attorney, Agent, or Firm* — Fujitsu Patent Center

(57) ABSTRACT

A device includes a memory that stores a measurement-result of a first magnetization of a permanent-magnet corresponding to an external-magnetic field in an open-magnetic circuit; and a processor to divide the permanent-magnet into meshes, generate a function based on the measurement-result, the function indicating a second magnetization corresponding to the external-magnetic field in a closed-magnetic circuit, the function including a parameter having a value, calculate a diamagnetic-field corresponding to the external-magnetic field based on the second magnetization for each of the meshes, calculate a third magnetization of the permanent-magnet, calculate an average of the third magnetizations, calculate an error between the first magnetization and the calculated average, correct the value of the parameter, and repeat the calculation of the second magnetization, the diamagnetic-field, the third magnetizations, the average, and the error, and the correction of the value of the parameter until the error falls below a threshold.

7 Claims, 16 Drawing Sheets

FIG. 8
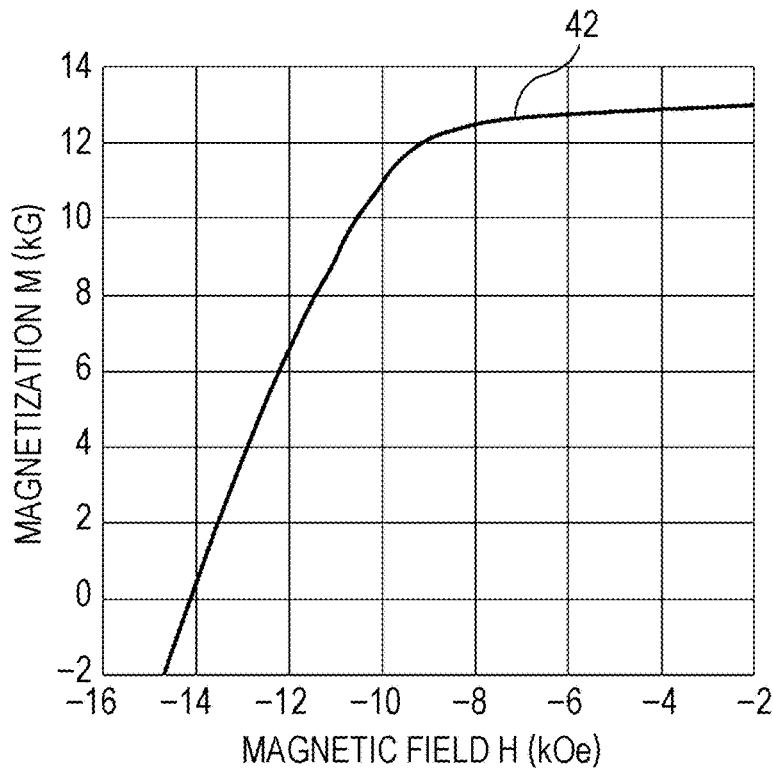
↓ ELIMINATE INFLUENCE OF DIAMAGNETIC FIELD
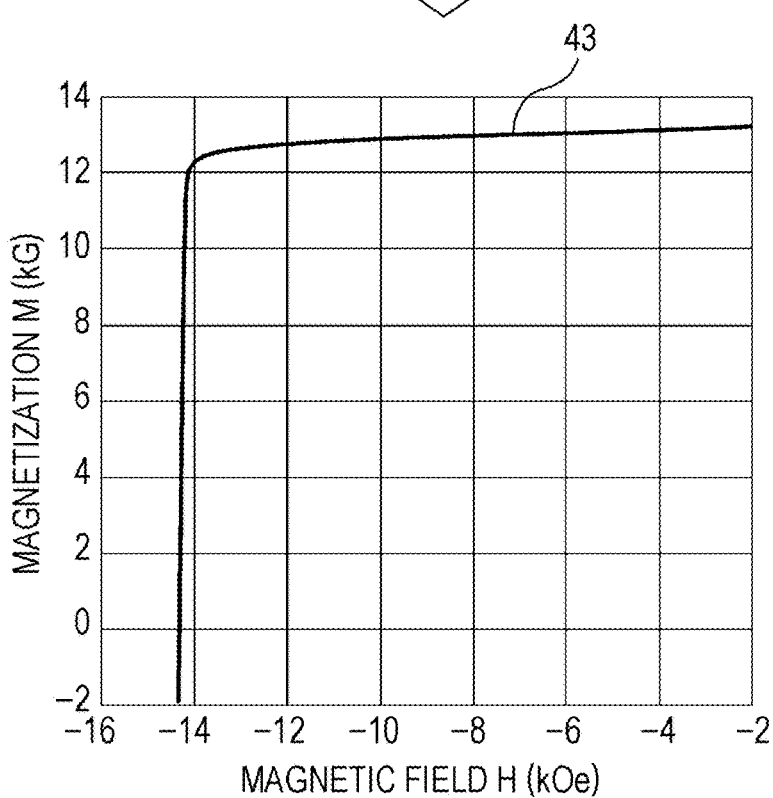

$$g(H) = M_r^{open} \times tanh\frac{H-H_c^{open}}{10^4(1+N(H))}$$

INFORMATION PROCESSING DEVICE, CLOSED MAGNETIC CIRCUIT COMPUTING METHOD, AND CLOSED MAGNETIC CIRCUIT COMPUTING SYSTEM

CROSS-REFERENCE TO RELATED APPLICATION

This application is based upon and claims the benefit of priority of the prior Japanese Patent Application No. 2018-112073, filed on Jun. 12, 2018, the entire contents of which are incorporated herein by reference.

FIELD

The embodiments discussed herein are related to an information processing device, a closed magnetic circuit computing method, and a closed magnetic circuit computing system.

BACKGROUND

A permanent magnet is used in various industrial products. The permanent magnet has a physical quantity called magnetization. The magnetization of the permanent magnet changes when an external magnetic field is applied to the permanent magnet. A degree of magnetization of the permanent magnet corresponding to the external magnetic field is represented by a magnetization curve. That is, for example, a magnetic characteristic of the permanent magnet is seen from the magnetization curve.

The magnetization of the permanent magnet is affected by a magnetic field (a diamagnetic field) generated by the magnetization of the permanent magnet itself. A value of the diamagnetic field varies depending on the shape of the permanent magnet and a measurement environment. Therefore, the diamagnetic field does not represent a physical characteristic of the permanent magnet. The influence of the diamagnetic field of the permanent magnet may be avoided by measuring the magnetization in an environment of a closed magnetic circuit (an environment in which magnetic lines of force do not leak to the outside). Therefore, for example, a measuring device (a closed-magnetic-circuit measuring device) that may create a measurement environment of a closed magnetic circuit is used to measure a magnetic characteristic of the permanent magnet.

The closed-magnetic-circuit measuring device may avoid the diamagnetic field. However, since the intensity of an external magnetic field that may be generated by the closed-magnetic-circuit measuring device is insufficient, the closed-magnetic-circuit measuring device is unable to measure a magnetic characteristic of a permanent magnet having a strong magnetic force such as neodymium magnet. Accordingly, the measurement of a magnetic characteristic in the closed magnetic circuit is not versatile. Therefore, in many cases, the magnetic characteristic of the permanent magnet is obtained by: measuring the magnetization in an environment of an open magnetic circuit affected by the diamagnetic field (an environment in which magnetic lines of force leak to the outside); and correcting the measured magnetization using a predetermined correction formula to exclude the influence of the diamagnetic field.

As a magnetization measurement technique, for example, there is a magnetic characteristic measuring method in which an M-H hysteresis loop in a direction of easy magnetization of a magnetic material film, the direction of easy magnetization of which is inclined with respect to a film in-plane direction, is measured by correctly correcting a diamagnetic field.

Related technique is disclosed in, for example, Japanese Laid-open Patent Publication No. 08-201494.

SUMMARY

According to an aspect of the embodiments, an information processing device includes: a memory configured to store a measurement result of a first magnetization of a permanent magnet corresponding to an external magnetic field in an open magnetic circuit environment; and a processor configured to divide the permanent magnet into a plurality of meshes, generate a function based on the measurement result, the function indicating a second magnetization corresponding to the external magnetic field in a closed magnetic circuit environment, the function including a parameter having a value corresponding to the external magnetic field, calculate the second magnetization corresponding to the external magnetic field based on the function for each of the meshes, calculate a diamagnetic field corresponding to the external magnetic field based on the second magnetization for each of the meshes, calculate, for each of the meshes based on the function, a third magnetization of the permanent magnet corresponding to the external magnetic field in the open magnetic circuit environment in a state where influence of the diamagnetic field is applied to the external magnetic field, calculate an average of the third magnetizations of the meshes corresponding to the external magnetic field, calculate an error between the first magnetization indicated by the measurement result and the calculated average of the third magnetizations, correct the value of the parameter corresponding to the external magnetic field based on the error, and repeat the calculation of the second magnetization, the calculation of the diamagnetic field, the calculation of the third magnetizations, the calculation of the average, the calculation of the error, and the correction of the value of the parameter until the error falls below a threshold.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 8 is a diagram illustrating a difference between an open magnetic circuit curve and a closed magnetic circuit curve;

DESCRIPTION OF EMBODIMENTS

In a correction method for a diamagnetic field in the past, for example, a value of magnetization is corrected using a uniform correction coefficient for various kinds of permanent magnets. However, accuracy is insufficient in the correction method for a diamagnetic field in the past. Therefore, the influence of the diamagnetic field is not appropriately excluded and measurement accuracy of a magnetic characteristic is insufficient.

Embodiments are explained below with reference to the drawings. The embodiments may be combined and carried out in a range without contradiction.

First Embodiment

First, a first embodiment is explained. In the first embodiment, a measurement result in an open magnetic circuit environment is corrected and a magnetic characteristic with influence of a diamagnetic field excluded is highly accurately calculated according to a numerical calculation by a finite element method in which a mesh model of a permanent magnet is used.

Figure 1:
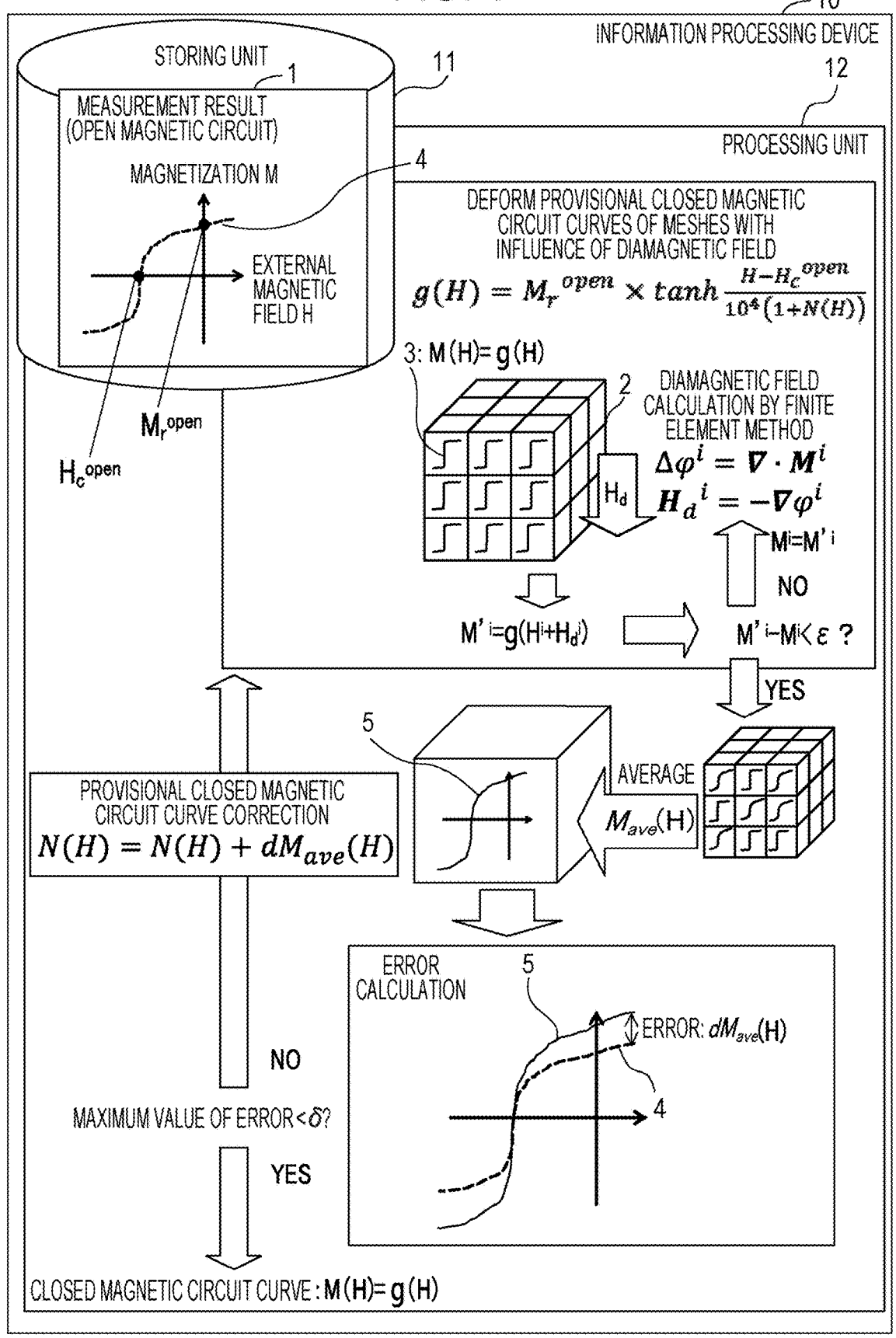
FIG. 1 is a diagram illustrating a functional configuration example of a device according to a first embodiment.

FIG. 1 is a diagram illustrating a functional configuration example of a device according to the first embodiment. An information processing device 10 includes a storing unit 11 and a processing unit 12. The information processing device 10 is, for example, a computer. The storing unit 11 is, for example, a memory or a storage device included in the information processing device 10. The processing unit 12 is, for example, a processor or an arithmetic circuit included in the information processing device 10.

The storing unit 11 stores a measurement result 1 of a first magnetization a permanent magnet corresponding to an external magnetic field H in an open magnetic circuit environment. Since the first magnetization is measured in the open magnetic circuit environment, the first magnetization is affected by a diamagnetic field $H_d$. When a magnetization corresponding to the external magnetic field H indicated by the measurement result 1 is plotted on a graph having the external magnetic field H and the magnetization M as axes, an open magnetic circuit curve 4 indicating a magnetic characteristic in an open magnetic circuit environment is obtained. The open magnetic circuit curve 4 is a curve indicating a magnetic characteristic obtained from a measured value.

First, the processing unit 12 generates a mesh model 2 in which the permanent magnet is divided into a plurality of meshes. Subsequently, based on the measurement result 1, the processing unit 12 generates a function (g(H)) indicating a second magnetization (M(H)) of the permanent magnet corresponding to the external magnetic field H in a closed magnetic circuit environment, the function (g(H)) including a parameter (a correction coefficient N(H)) having a value corresponding to the external magnetic field H. For example, with the generated function (g(H)), a value of second magnetization in the state where the external magnetic field H is 0 equals to a value of first magnetization (a residual magnetization value: $M_r^{open}$) in the state where the external magnetic field H in a measurement result is 0. With the function (g(H)), a value of the external magnetic field H in which the second magnetization is 0 equals to a value (a coercive force $H_c^{open}$) of the external magnetic field H in which the first magnetization is 0 in the measurement result. The function (g(H)) is, for example, a hyperbolic tangent function.

The function (g(H)) represents a provisional closed magnetic circuit curve 3. The processing unit 12 corrects the provisional closed magnetic circuit curve 3 indicated by the function (g(H)) to generate a closed magnetic circuit curve highly accurately indicating a magnetic characteristic of the permanent magnet. For example, the processing unit 12 changes the value corresponding to the external magnetic field H of the parameter (the correction coefficient N(H)) to correct the provisional closed magnetic circuit curve 3.

In order to correct the provisional closed magnetic circuit curve 3, for example, the processing unit 12 assumes that all the meshes of the permanent magnet have the same closed magnetic circuit curve. The processing unit 12 calculates, based on the function (g(H)), according to the finite element method, a magnetization (third magnetization) of each of the meshes corresponding to the external magnetic field H and reflecting the influence of the diamagnetic field $H_d$. For example, for each of a plurality of values of the external magnetic field H indicated by the measurement result 1, the processing unit 12 calculates the third magnetizations of the meshes.

In the calculation of the third magnetizations, for each of the meshes, the processing unit 12 first calculates the second magnetization corresponding to the external magnetic field H based on the function (g(H)). At this stage, in the second magnetization, the influence of the diamagnetic field $H_d$ is not taken into account. Therefore, for each of the meshes, the processing unit 12 calculates the diamagnetic field $H_d$ corresponding to the external magnetic field H based on the second magnetization. Subsequently, for each of the meshes, the processing unit 12 calculates, based on a function, the third magnetizations of the permanent magnet corresponding to the external magnetic field H in the open magnetic circuit environment where the influence of the diamagnetic field $H_d$ is applied to the external magnetic field H.

In the calculation of the third magnetizations, for example, the processing unit 12 performs the following processing for each of the meshes. First, the processing unit 12 sets the second magnetization calculated by the function (g(H)) as an initial value of a provisional third magnetization. Subsequently, the processing unit 12 repeats calculation of the diamagnetic field $H_d$ based on the provisional third magnetization, calculation of a magnetization corresponding to the external magnetic field H and the diamagnetic field $H_d$ based on the function, and update of the provisional third magnetization to the magnetization until a difference between the pre-update provisional third magnetization and the post-update provisional third magnetization falls below an error threshold ε. The processing unit 12 sets, as the third magnetization, the provisional third magnetization where the difference between the pre-update provisional third magnetization and the post-update provisional third magnetization falls below the error threshold ε.

After the third magnetizations of the meshes are calculated, the processing unit 12 calculates an average (average magnetization $M_{ave}(H)$) of the third magnetizations of the meshes corresponding to the external magnetic field H. For example, the processing unit 12 calculates an arithmetic mean of the calculated third magnetizations of the meshes corresponding to each of the values of the external magnetic field H indicated by the measurement result 1. The average magnetization $M_{ave}(H)$ calculated in this way represents an open magnetic circuit curve 5 obtained as a calculation result based on the provisional closed magnetic circuit curve 3. If the open magnetic circuit curve 5 obtained as the calculation result is equal to the open magnetic circuit curve 4 obtained as the measured value, the provisional closed magnetic circuit curve 3, based on which the open magnetic circuit curve 5 is calculated, correctly represents the magnetic characteristic of the permanent magnet.

Therefore, the processing unit 12 calculates a magnetization difference $dM_{ave}(H)$ indicating a difference between the first magnetization indicated by the measurement result and the calculated average (the average magnetization $M_{ave}(H)$) of the third magnetizations. A value of the magnetization difference $dM_{ave}(H)$ changes according to the value of the external magnetic field H. If a maximum value of the magnetization difference $dM_{ave}(H)$ is equal to or more than a threshold δ, the processing unit 12 corrects a value of a parameter corresponding to the external magnetic field H based on the magnetization difference $dM_{ave}(H)$. For example, the processing unit 12 corrects a value of the correction coefficient N(H) to a value obtained by adding the magnetization difference $dM_{ave}(H)$ to a present value of the correction coefficient N(H).

Thereafter, the processing unit 12 repeats the calculation of the second magnetization, the calculation of the diamagnetic field $H_d$, the calculation of the third magnetizations, the calculation of the average, the calculation of the error, and the correction of the value of the parameter until the error falls below the threshold δ. When the error falls below the threshold δ, the processing unit 12 outputs the second magnetization corresponding to the external magnetic field H calculated based on the function (g(H)) after the correction of the value of the parameter.

In this way, the information processing device 10 may correct the provisional closed magnetic circuit curve 3 such that the open magnetic circuit curve 5 obtained as a calculation result is equal to a measured open magnetic circuit curve 4. The corrected provisional closed magnetic circuit curve 3 is output as a closed magnetic circuit curve indicating the magnetic characteristic of the permanent magnet by the information processing device 10. If the influence of the diamagnetic field $H_d$ is added to the output closed magnetic circuit curve, the closed magnetic circuit curve is equal to the open magnetic circuit curve 4, which is the measured value. Therefore, the closed magnetic circuit curve is considered to highly accurately represent a magnetic characteristic of the permanent magnet in the closed magnetic circuit environment.

The magnetic characteristic in the closed magnetic circuit environment may be highly accurately calculated based on the measurement result 1 in the open magnetic circuit environment. Therefore, a correct magnetic characteristic may be obtained for a magnet having a strong magnetic force for which measurement in the closed magnetic circuit environment is difficult such as a neodymium magnet.

Second Embodiment

A second embodiment is explained.

Figure 2:
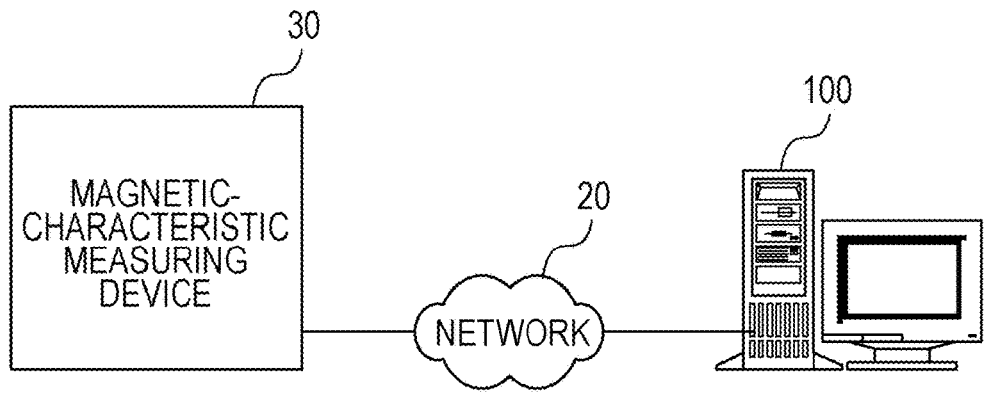
FIG. 2 is a diagram illustrating a system configuration example in a second embodiment.

FIG. 2 is a diagram illustrating a system configuration example in the second embodiment. A magnetic-characteristic measuring device 30 is connected to a computer 100 via a network 20. The magnetic-characteristic measuring device 30 is a device that may measure magnetization of a permanent magnet according to an open magnetic circuit environment. The computer 100 calculates a magnetic characteristic in a closed magnetic circuit environment based on a measurement result of a magnetic characteristic in the open magnetic circuit environment in the magnetic-characteristic measuring device 30.

Figure 3:
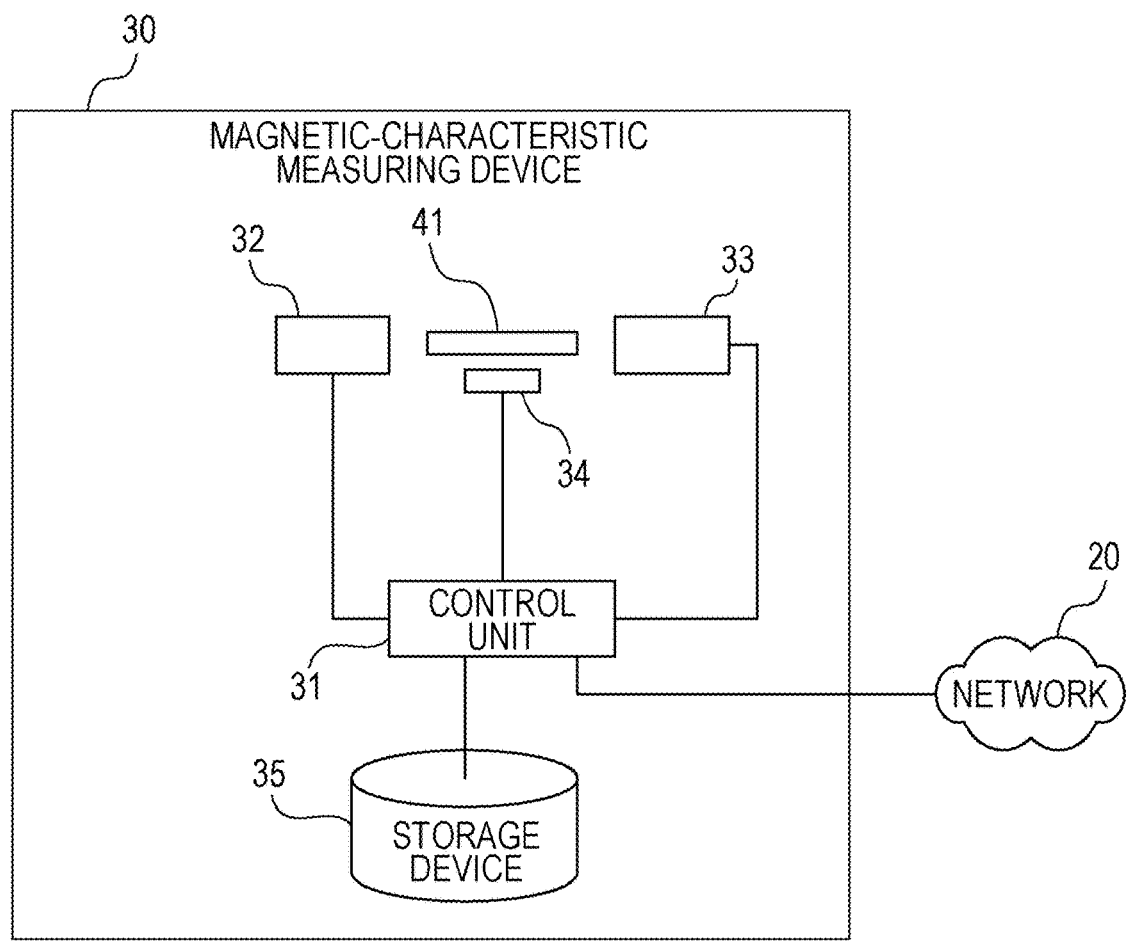
FIG. 3 is a diagram illustrating an example of a magnetic-characteristic measuring device.

FIG. 3 is a diagram illustrating an example of the magnetic-characteristic measuring device. The magnetic-characteristic measuring device 30 measures, according to control of a control unit 31, a magnetic characteristic of a permanent magnet 41 prepared as a specimen. For example, the control unit 31 generates, with a plurality of excitation coils 32 and 33, an external magnetic field around the permanent magnet 41. The intensity of the external magnetic field is represented by a unit such as ampere per meter (A/m) or oersted (Oe).

The control unit 31 detects, using a magnetic field sensor 34, a magnetic field generated by magnetization of the permanent magnet 41. The control unit 31 measures a magnetization of the permanent magnet corresponding to the external magnetic field based on the detected magnetic field. The magnetization is represented by a unit such as gauss (G).

For example, the control unit 31 generates a strong external magnetic field and magnetizes the permanent magnet 41 until the magnetization is saturated. The magnetic-characteristic measuring device 30 measures the magnetization of the permanent magnet 41 corresponding to the external magnetic field while reducing the intensity of the external magnetic field. After the intensity of the external magnetic field decreases to "0", the magnetic-characteristic measuring device 30 intensifies the external magnetic field (a diamagnetic field) in the opposite direction of a direction during the magnetizing and measures magnetization of the permanent magnet 41 corresponding to the external magnetic field. Consequently, a measurement result indicating a demagnetization curve is obtained.

The control unit 31 stores a value of the measured magnetization in a storage device 35 as a measurement result. The control unit 31 transmits the measurement result to the computer 100 via the network 20 according to a request from the computer 100.

In FIG. 3, two excitation coils 32 and 33 are illustrated in the magnetic-characteristic measuring device 30. However, a not-illustrated excitation coil is also present around the permanent magnet 41. In the magnetic-characteristic measuring device 30, a magnetic field sensor may be provided other than the magnetic field sensor 34 illustrated in FIG. 3.

Figure 4:
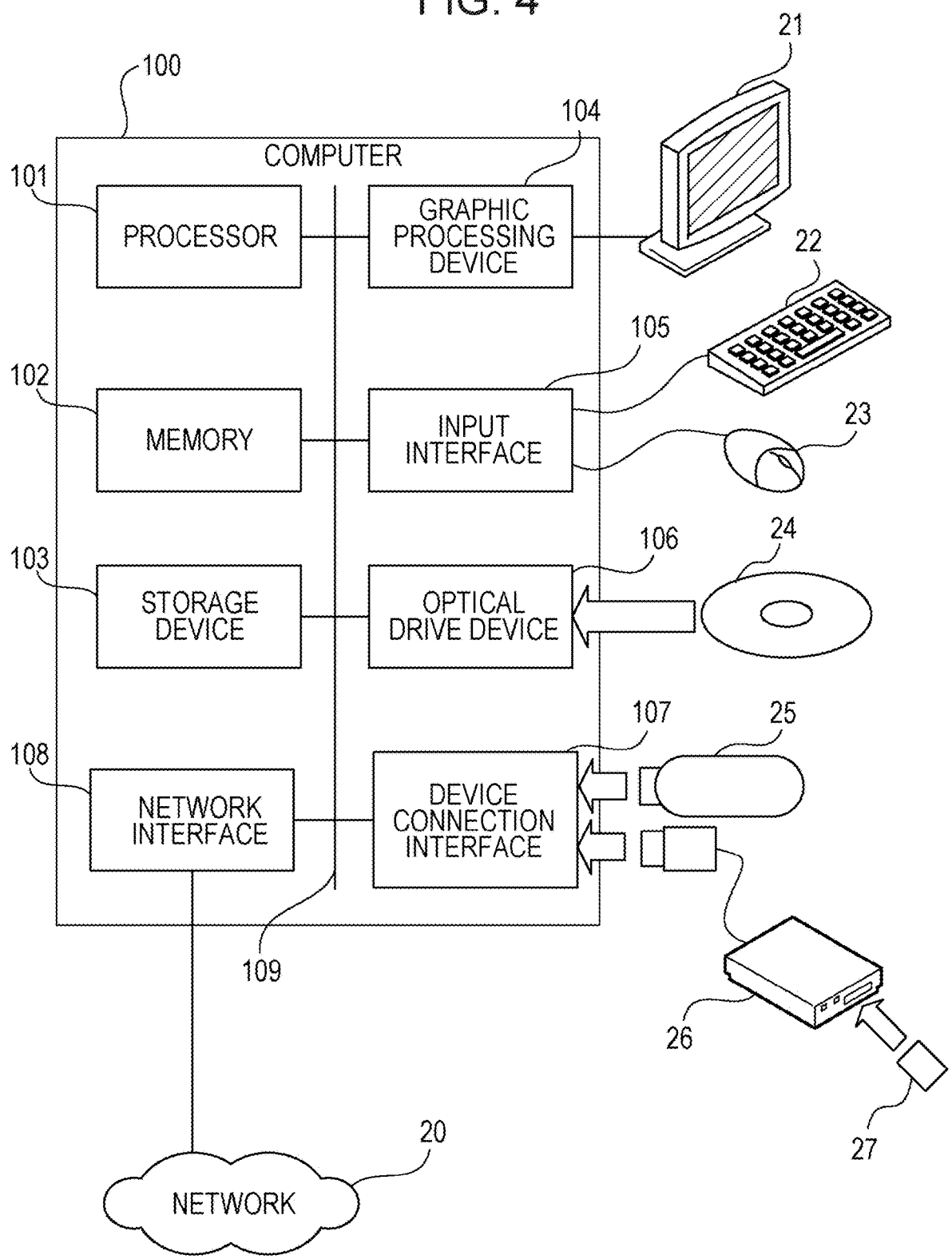
FIG. 4 is a diagram illustrating a configuration example of hardware of a computer.

FIG. 4 is a diagram illustrating a configuration example of hardware of the computer. The entire computer 100 is controlled by a processor 101. A memory 102 and a plurality of peripheral devices are connected to the processor 101 via a bus 109. The processor 101 is, for example, a central processing unit (CPU), a micro processing unit (MPU), or a digital signal processor (DSP). At least a part of functions realized by the processor 101 executing programs may be realized by an electronic circuit such as an application specific integrated circuit (ASIC) or a programmable logic device (PLD). The processor 101 may be a single CPU, a multiple-CPU, a multi-core CPU, or a multiprocessor.

The memory 102 is used as a main storage device of the computer 100. In the memory 102, a program of an operating system (OS) and at least a part of application programs executed by the processor 101 are temporarily stored. In the memory 102, various data used for processing by the processor 101 are stored. As the memory 102, a volatile semiconductor storage device such as a random access memory (RAM) is used.

As the peripheral devices connected to the bus 109, there are a storage device 103, a graphic processing device 104, an input interface 105, an optical drive device 106, a device connection interface 107, and a network interface 108.

The storage device 103 electrically or magnetically writes data in and reads out data from a recording medium incorporated in the storage device 103. The storage device 103 is used as an auxiliary storage device of the computer. A program of an OS, application programs, and various data are stored in the storage device 103. As the storage device 103, for example, a hard disk drive (HDD) and a solid state drive (SSD) may be used.

A monitor 21 is connected to the graphic processing device 104. The graphic processing device 104 causes, according to a command from the processor 101, the monitor 21 to display an image on a screen of the monitor 21. As the monitor 21, there are an organic electroluminescence display device, a liquid crystal display device, and the like.

A keyboard 22 and a mouse 23 are connected to the input interface 105. The input interface 105 transmits signals sent from the keyboard 22 and the mouse 23 to the processor 101. The mouse 23 is an example of a pointing device. Other pointing devices may also be used. As the other pointing devices, there are a touch panel, a tablet, a touch pad, a trackball, and the like.

The optical drive device 106 reads data recorded in an optical disk 24 using a laser beam or the like. The optical disk 24 is a portable recording medium in which data is recorded to be readable by reflection of light. As the optical disk 24, there are a digital versatile disc (DVD), a DVD-RAM, a compact disc read only memory (CD-ROM), a CD-R (Recordable)/RW (Rewritable), and the like.

The device connection interface 107 is a communication interface for connecting peripheral devices to the computer 100. For example, a memory device 25 and a memory reader writer 26 may be connected to the device connection interface 107. The memory device 25 is a recording medium implemented with a communication function for communication with the device connection interface 107. The memory reader writer 26 is a device that writes data in and reads out data from a memory card 27. The memory card 27 is a card-type recording medium.

The network interface 108 is connected to the network 20. The network interface 108 performs transmission and reception of data between the network interface 108 and other computers or communication devices via the network 20.

The computer 100 may realize processing functions in the second embodiment with the hardware configuration explained above. The information processing device 10 explained in the first embodiment may be realized by the same hardware as the computer 100 illustrated in FIG. 4.

The computer 100 realizes the processing functions in the second embodiment by, for example, executing programs recorded in a computer-readable recording medium. Programs describing processing contents to be executed by the computer 100 may be recorded in various recording media. For example, programs to be executed by the computer 100 may be stored in the storage device 103. The processor 101 loads at least a part of the programs in the storage device 103 to the memory 102 and executes the programs. The programs to be executed by the computer 100 may be recorded in a portable recording medium such as the optical disk 24, the memory device 25, or the memory card 27. The programs stored in the portable recording medium may be executed after being installed in the storage device 103 according to, for example, control from the processor 101. The processor 101 may directly read out the programs from the portable recording medium and execute the programs.

The computer 100 having such a hardware configuration may highly accurately calculate a magnetic characteristic of the permanent magnet 41.

Figure 5:
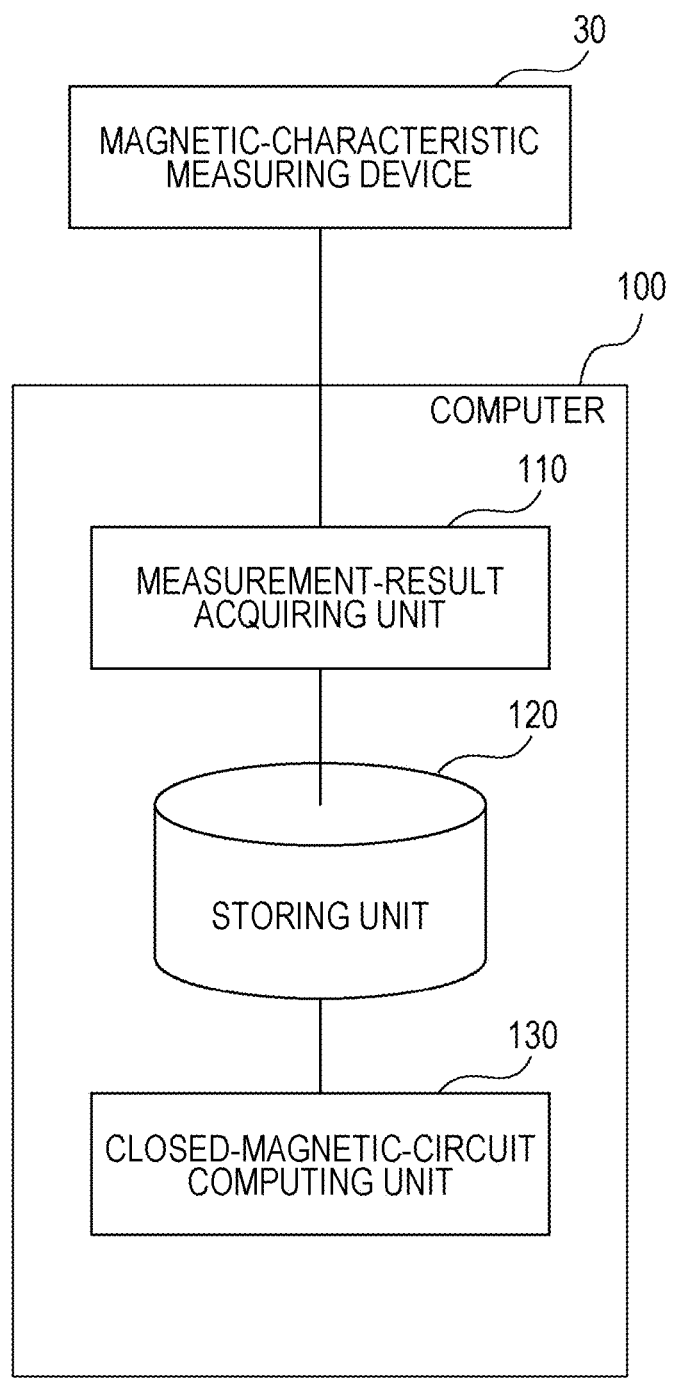
FIG. 5 is a block diagram illustrating an example of a magnetic-characteristic calculating function in the computer.

FIG. 5 is a block diagram illustrating an example of a magnetic characteristic calculation function in the computer. The computer 100 includes a measurement-result acquiring unit 110, a storing unit 120, and a closed-magnetic-circuit computing unit 130.

The measurement-result acquiring unit 110 acquires a measurement result in an open magnetic circuit environment from the magnetic-characteristic measuring device 30 via the network 20. The measurement-result acquiring unit 110 stores the acquired measurement result in the storing unit 120.

The storing unit 120 stores the measurement result. The storing unit 120 is, for example, a part of a storage region of the storage device 103.

The closed-magnetic-circuit computing unit 130 applies correction to the measurement result by the magnetic-characteristic measuring device 30 to exclude the influence of a diamagnetic field and calculates a closed magnetic circuit curve indicating a magnetic characteristic in a closed magnetic circuit environment. For example, based on the measurement result in the open magnetic circuit environment, the closed-magnetic-circuit computing unit 130 calculates a correction coefficient of the permanent magnet 41 used as a specimen for excluding the influence of the diamagnetic field in the measurement result. For example, the closed-magnetic-circuit computing unit 130 calculates an appropriate correction coefficient for each level of the intensity of an external magnetic field used for measurement. Subsequently, the closed-magnetic-circuit computing unit 130 corrects, with the correction coefficient, magnetization data of the permanent magnet 41 indicated by the measurement result to calculate a closed magnetic circuit curve indicating a magnetic characteristic in a closed magnetic circuit of the permanent magnet 41. The closed-magnetic-circuit computing unit 130 outputs the calculated closed magnetic circuit curve. For example, the closed-magnetic-circuit computing unit 130 stores data of the closed magnetic circuit curve in the storage device 103. The closed-magnetic-circuit computing unit 130 displays the calculated closed magnetic circuit curve on the monitor 21 as a graph.

The functions of the elements illustrated in FIG. 5 may be realized by, for example, causing the computer to execute program modules corresponding to the elements.

Figure 6:
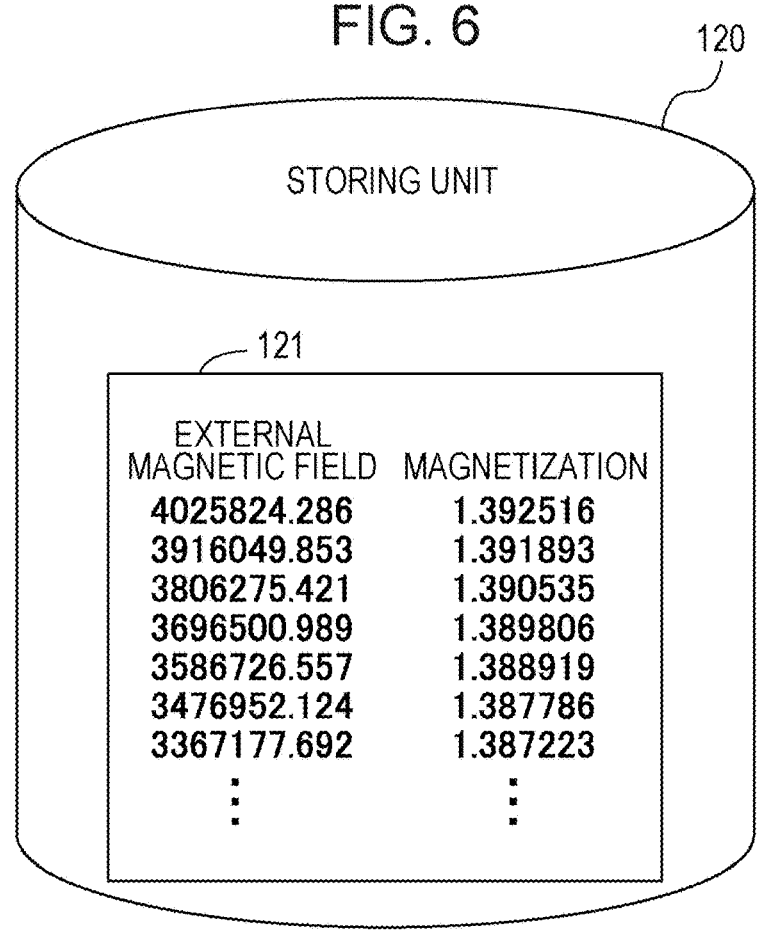
FIG. 6 is a diagram illustrating an example of a measurement result stored in a storing unit.

FIG. 6 is a diagram illustrating an example of a measurement result stored in the storing unit. In a measurement result 121, for each of external magnetic fields during measurement, a value of magnetization (kG) of the permanent magnet 41 in the external magnetic field (A/m) is set.

The measurement result 121 acquired from the magnetic-characteristic measuring device 30 represents a magnetic characteristic including the influence of a diamagnetic field.

Figure 7:
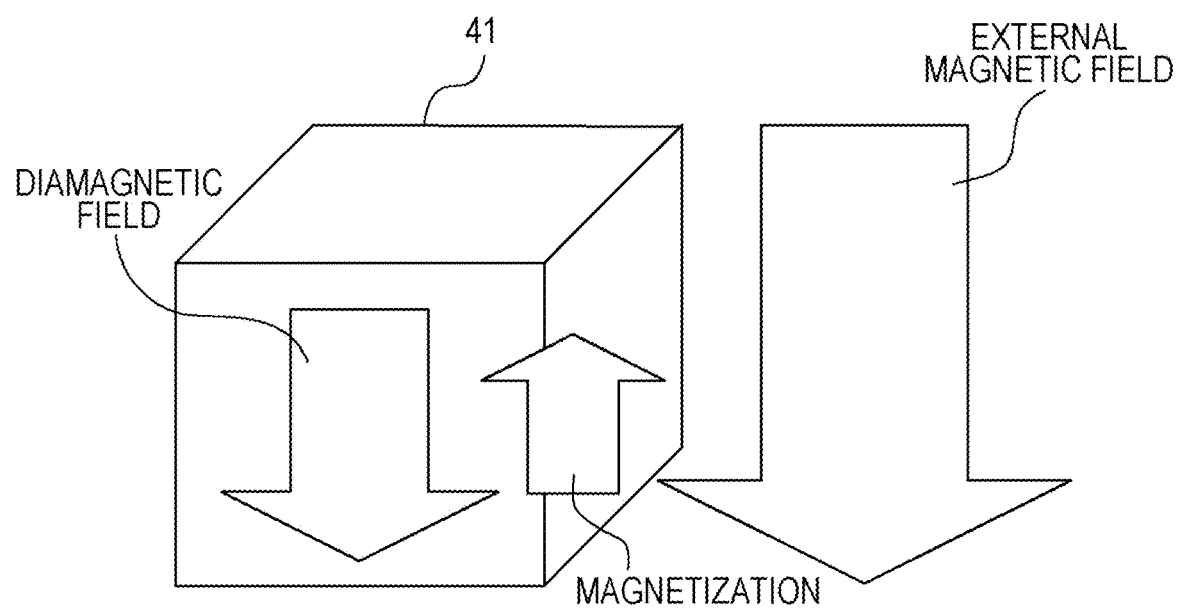
FIG. 7 is a diagram illustrating an example of a magnetic field generated during magnetization characteristic measurement.

FIG. 7 is a diagram illustrating an example of a magnetic field generated during magnetization characteristic measurement. In the example illustrated in FIG. 7, an external magnetic field is generated in a Z-axis direction (an up-down direction in FIG. 7) of a space in which the permanent magnet 41 is disposed. The permanent magnet 41 is magnetized by the influence of the external magnetic field. When the permanent magnet 41 is magnetized, a diamagnetic field is generated inside the permanent magnet 41. The intensity of the magnetization of the permanent magnet 41 is affected by the diamagnetic field generated by the magnetization of the permanent magnet 41.

The measurement result 121 by the open magnetic circuit environment represents a magnetic characteristic of the permanent magnet including the influence of the diamagnetic field. A demagnetization curve representing such a magnetic characteristic is an open magnetic circuit curve. On the other hand, when a magnetic characteristic may be measured in the closed magnetic circuit environment, a demagnetization curve with the influence of the diamagnetic field excluded is obtained. Such a demagnetization curve is a closed magnetic circuit curve.

FIG. 8 is a diagram illustrating a difference between the open magnetic circuit curve and the closed magnetic circuit curve. In FIG. 8, an open magnetic circuit curve 42 is illustrated in an upper part and a closed magnetic circuit curve 43 is illustrated in a lower part. In the open magnetic circuit environment, as illustrated in FIG. 7, the diamagnetic field in the same direction as the external magnetic field is generated. Therefore, the open magnetic circuit curve 42 has a shape different from the closed magnetic circuit curve 43 with the influence of the diamagnetic field excluded.

Therefore, the open magnetic circuit curve 42 is corrected to calculate the closed magnetic circuit curve 43 using the computer 100. As a correction formula for excluding the influence of the diamagnetic field, for example, a method of subtracting contribution of the diamagnetic field from a value of the external magnetic field of the measurement result 121 is conceivable. As a simple method, there is a method of deciding a fixed correction coefficient in advance and correcting the value of the external magnetic field using the correction coefficient.

Figure 9:
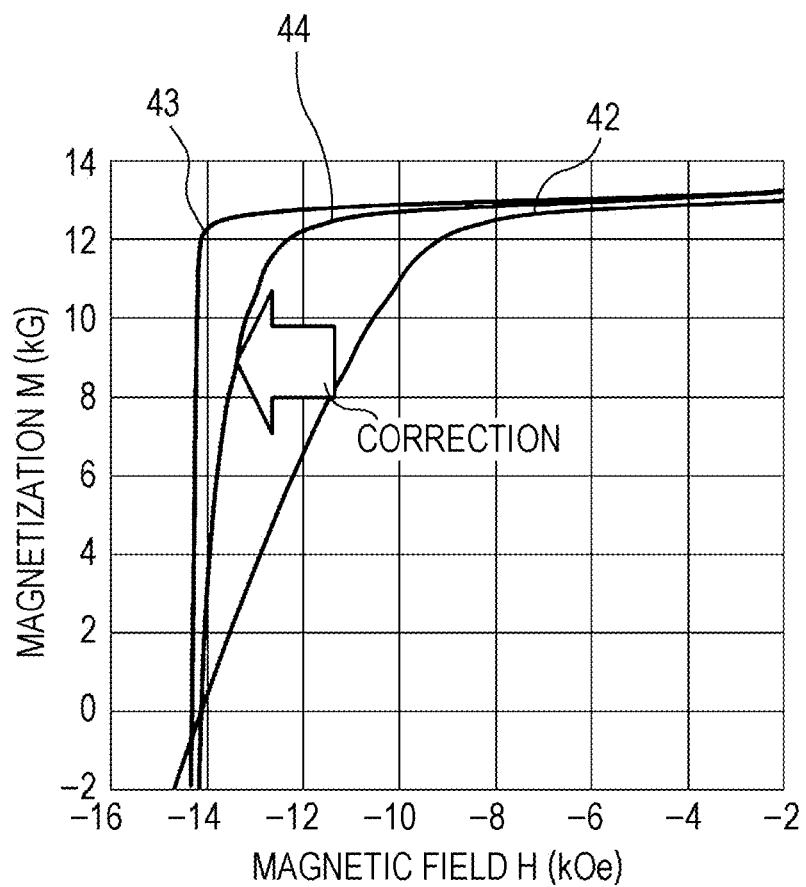
FIG. 9 is a diagram illustrating a correction example of the open magnetic circuit curve corrected by a fixed correction coefficient.

FIG. 9 is a diagram illustrating a correction example of the open magnetic circuit curve corrected by the fixed correction coefficient. For example, the value of the external magnetic field H of the measurement result 121 is replaced with "H-NM". N represents a correction coefficient. M represents magnetization. If the correction coefficient is a constant such as 0.264, a corrected open magnetic circuit curve 44 illustrated in FIG. 9 is obtained. However, when the correction coefficient is the fixed value in this way, as illustrated in FIG. 9, the corrected open magnetic circuit curve 44 is unable to be matched with the closed magnetic circuit curve 43.

Therefore, the closed-magnetic-circuit computing unit 130 of the computer 100 performs correction of the open magnetic circuit curve using numerical calculation by the finite element method in which a mesh model of the permanent magnet 41 is used.

Figure 10:
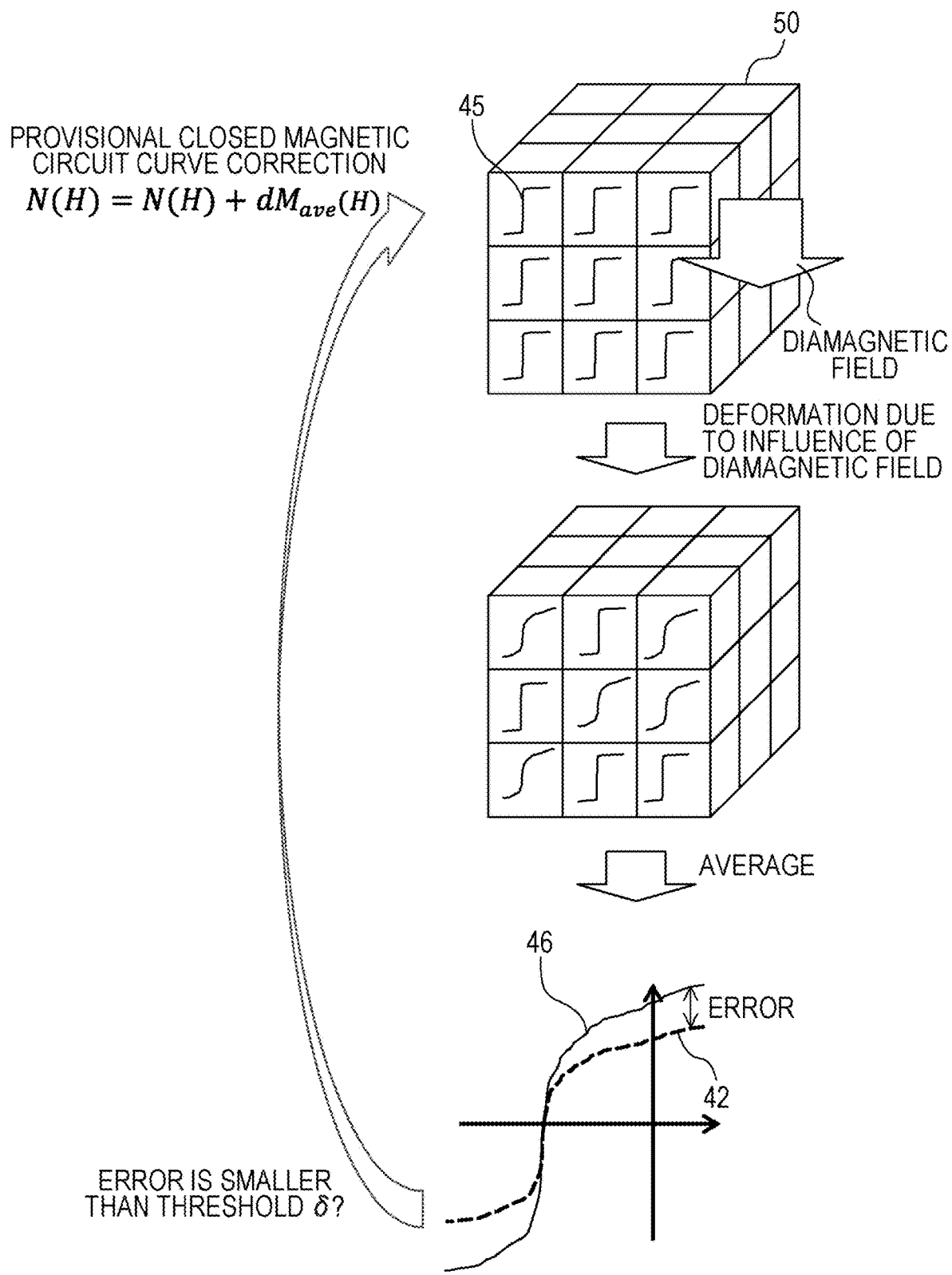
FIG. 10 is a diagram illustrating an example of a correction method for the open magnetic circuit curve.

FIG. 10 is a diagram illustrating an example of a correction method for the open magnetic circuit curve. First, the closed-magnetic-circuit computing unit 130 calculates provisional closed magnetic circuit curves 45 using parameters obtained from the measured open magnetic circuit curve 42. Sufficient accuracy is not obtained in a closed magnetic circuit curve calculated in an initial state.

The closed-magnetic-circuit computing unit 130 divides a region where the permanent magnet 41 is present into a plurality of meshes and generates a mesh model 50. The closed-magnetic-circuit computing unit 130 assumes that all the meshes have the same provisional closed magnetic circuit curves 45. At this time, it is assumed that the provisional closed magnetic circuit curve 45 is deformed in each of the meshes by the influence of the diamagnetic field and an average of the deformed provisional closed magnetic circuit curves 45 in all the meshes is an open magnetic circuit curve. Therefore, the closed-magnetic-circuit computing unit 130 adds the deformation due to the influence of the diamagnetic field to the provisional closed magnetic circuit curves 45 of the meshes. The closed-magnetic-circuit computing unit 130 calculates an average of provisional closed magnetic circuit curves of the meshes after the deformation and calculates an open magnetic circuit curve 46. If the closed magnetic circuit curves 45 calculated first are accurate, the calculated open magnetic circuit curve 46 may substantially equal to the open magnetic circuit curve 42 obtained as the measured value.

Therefore, the closed-magnetic-circuit computing unit 130 calculates an error (a magnetization difference $dM_{ave}(H)$) of magnetization between the open magnetic circuit curve 46 obtained as the calculation result and the open magnetic circuit curve 42 obtained as the measured value. If the error of the magnetization is not less than the threshold δ, the closed-magnetic-circuit computing unit 130 corrects the provisional closed magnetic circuit curves 45 such that the open magnetic circuit curve 46 of the calculation result approaches the measured open magnetic circuit curve 42. For example, the closed-magnetic-circuit computing unit 130 corrects the provisional closed magnetic circuit curves 45 by performing correction for adding the magnetization difference $dM_{ave}(H)$ to a value of the correction coefficient N(H) included in the expression used for calculation of the provisional closed magnetic circuit curves 45.

The closed-magnetic-circuit computing unit 130 repeats the calculation of the open magnetic circuit curve 46 based on the provisional closed magnetic circuit curves 45 and the correction of the provisional closed magnetic circuit curves 45 for reducing the error until the error falls below the predetermined threshold δ. The closed-magnetic-circuit computing unit 130 sets, as a closed magnetic circuit curve obtained by correcting the open magnetic circuit curve 42, the provisional closed magnetic circuit curves 45 obtained when the error falls below the predetermined threshold δ.

A correction method for the open magnetic circuit curve 42 illustrated in FIG. 10 is explained in detail below.

First, a calculation method for the provisional closed magnetic circuit curves 45 is explained.

Figure 11:
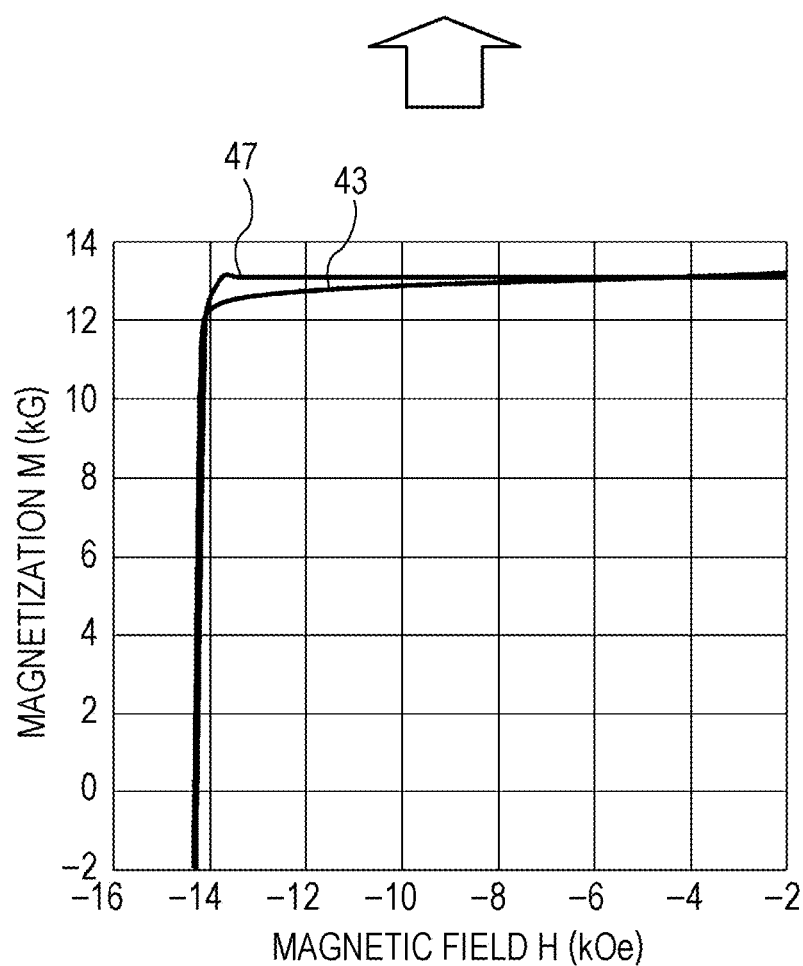
FIG. 11 is a diagram illustrating an example of a provisional closed magnetic circuit curve.

FIG. 11 is a diagram illustrating an example of a provisional closed magnetic circuit curve. The closed magnetic circuit curve 43 may be approximated using a tanh function (a hyperbolic tangent function) 47. For example, the closed-magnetic-circuit computing unit 130 sets, as a provisional closed magnetic circuit curve during a calculation start, the following function having the external magnetic field H as a variable.

$$g(H) = M_r^{open} \times \tanh\frac{H - H_c^{open}}{10^4(1 + N(H))} \quad (1)$$

$M_r^{open}$ represents a value of magnetization (a residual magnetization value) in an external magnetic field=0 of an open magnetic circuit curve. $H_c^{open}$ represents a value of the external magnetic field (a coercive force value) in the state where the magnetization of the open magnetic circuit curve is 0. N(H) represents a correction coefficient corresponding to the value of the external magnetic field. The correction of the provisional closed magnetic circuit curves 45 is performed by correcting a function of N(H). An initial state of N(H) is, for example, a state in which a value of N(H) is "0" for all external magnetic fields H.

Subsequently, the closed-magnetic-circuit computing unit 130 calculates magnetization of the meshes.

Figure 12:
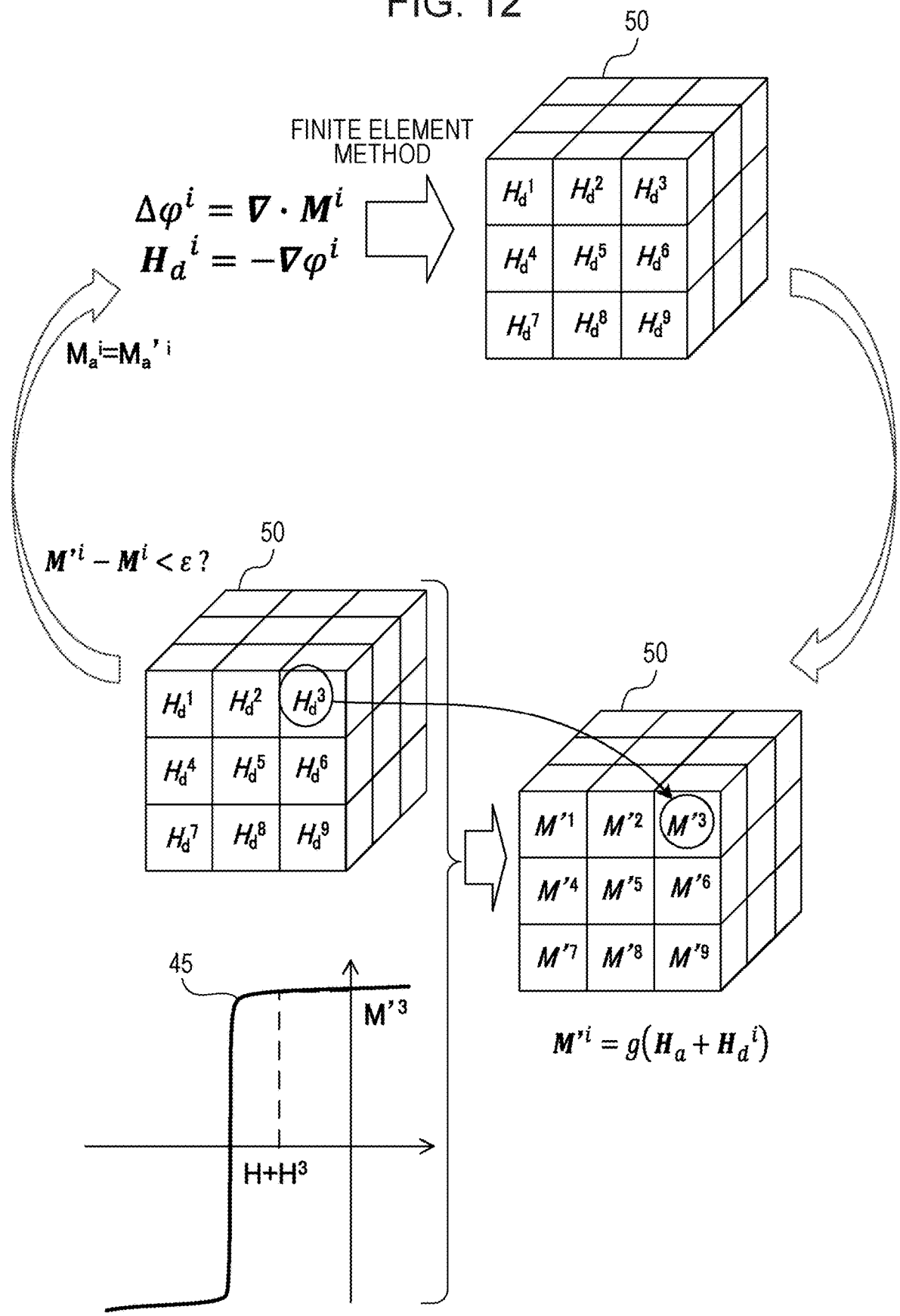
FIG. 12 is a diagram illustrating an example of a calculation method for magnetization.

FIG. 12 is a diagram illustrating an example of a calculation method for magnetization. First, using the finite element method, the closed-magnetic-circuit computing unit 130 calculates a diamagnetic field of each of the meshes corresponding to an external magnetic field in the position of the mesh concerned.

The diamagnetic field $H_d^i$ of an i-th (i is an integer equal to or larger than 1) mesh is represented by the following expression, where the external magnetic field is $H_a$.

$$\Delta\varphi^i = \nabla \cdot M^i \quad (2)$$

$$H_d^i = -\nabla\varphi^i \quad (3)$$

In Expression (2), $\Delta$ of represents Laplacian, $\nabla$ represents nabla indicating a differential operation of a vector, $M^i$ represents magnetization of the i-th mesh and is calculated by $g(H_a)$ based on Expression (1), and $\varphi^i$ represents a magnetic potential of the i-th mesh. The closed-magnetic-circuit computing unit 130 calculates diamagnetic fields of the meshes according to the finite element method using Expression (2) and Expression (3).

The closed-magnetic-circuit computing unit 130 calculates magnetization $M'^i$ including the influence of the diamagnetic field using the function of the provisional closed magnetic circuit curve indicated by Expression (1). That is, for example, the closed-magnetic-circuit computing unit 130 performs calculation of $M'^i = g(H_a + H_d^i)$.

The closed-magnetic-circuit computing unit 130 determines whether an error between the magnetization $M'^i$ calculated including the diamagnetic field and the magnetization $M^i$ is less than an error threshold $\varepsilon$. If the error is equal to or more than the error threshold $\varepsilon$, the closed-magnetic-circuit computing unit 130 substitutes the magnetization $M'^i$ into the magnetization $M^i$ and performs the calculation of the diamagnetic field $H_d^i$ by the finite element method again. The closed-magnetic-circuit computing unit 130 repeats the calculation of the diamagnetic field $H_d^i$ and the calculation of the magnetization $M'^i$ until the error falls below the error threshold $\varepsilon$. For all the meshes, the closed-magnetic-circuit computing unit 130 sets, as a calculation result of the magnetization under the external magnetic field of $H_a$, the magnetization $M^i$ of each of the meshes where the error falls below than the error threshold $\varepsilon$.

Figure 13:
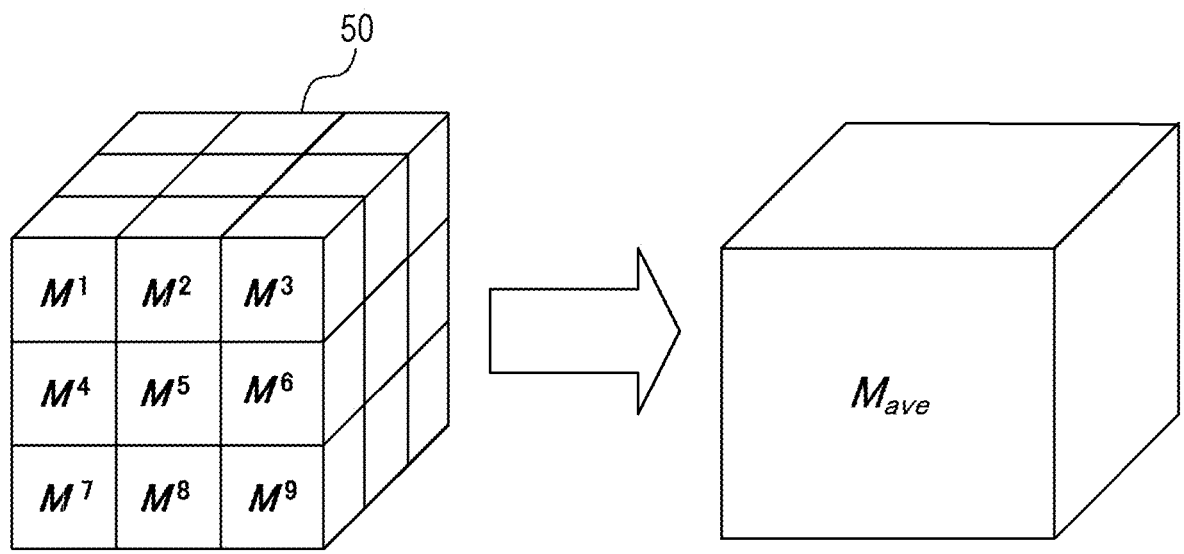
FIG. 13 is a diagram illustrating a calculation example of average magnetization.

When the magnetization of the meshes is successfully calculated, the closed-magnetic-circuit computing unit 130 calculates an average of the magnetization of the meshes. FIG. 13 is a diagram illustrating a calculation example of average magnetization. For example, average magnetization $M_{ave}$ under the external magnetic field of $H_a$ is represented by the following expression.

$$M_{ave} = \frac{1}{n}\sum_i M^i \quad (4)$$

In Expression (4), n represents the number of meshes (n is an integer equal to or larger than 1). The closed-magnetic-circuit computing unit 130 obtains average magnetization $M_{ave}(H)$ corresponding to the external magnetic field by calculating the average magnetization $M_{ave}$ while changing the external magnetic field. The closed-magnetic-circuit computing unit 130 calculates an error between the calculated average magnetization $M_{ave}(H)$ and the measurement result and sets the error as a magnetization difference $dM_{ave}(H)$.

The closed-magnetic-circuit computing unit 130 repeatedly performs the calculation of the magnetization difference $dM_{ave}(H)$ while changing the value of the external magnetic field H little by little. As a result, the magnetization difference $dM_{ave}(H)$ in each of a large number of values of external magnetic fields H at a predetermined interval width is obtained.

The closed-magnetic-circuit computing unit 130 corrects the correction coefficient N(H) using the magnetization differences $dM_{ave}(H)$ for each of the external magnetic fields H. For example, the closed-magnetic-circuit computing unit 130 sets, as a new correction coefficient N(H), a value obtained by adding the magnetization difference $dM_{ave}(H)$ to the present correction coefficient N(H).

The closed-magnetic-circuit computing unit 130 repeats the update of the correction coefficient N(H) until the magnetization difference $dM_{ave}(H)$ falls below a magnetization difference threshold $\delta$. When the magnetization difference $dM_{ave}(H)$ is less than the magnetization difference threshold $\delta$, the closed-magnetic-circuit computing unit 130 calculates a closed magnetic circuit curve according to Expression (1) using the correction coefficient N(H) at that point in time.

Details of a procedure of correction processing for an open magnetization circuit curve by the closed-magnetic-circuit computing unit 130 is explained below with reference to a flowchart.

Figure 14:
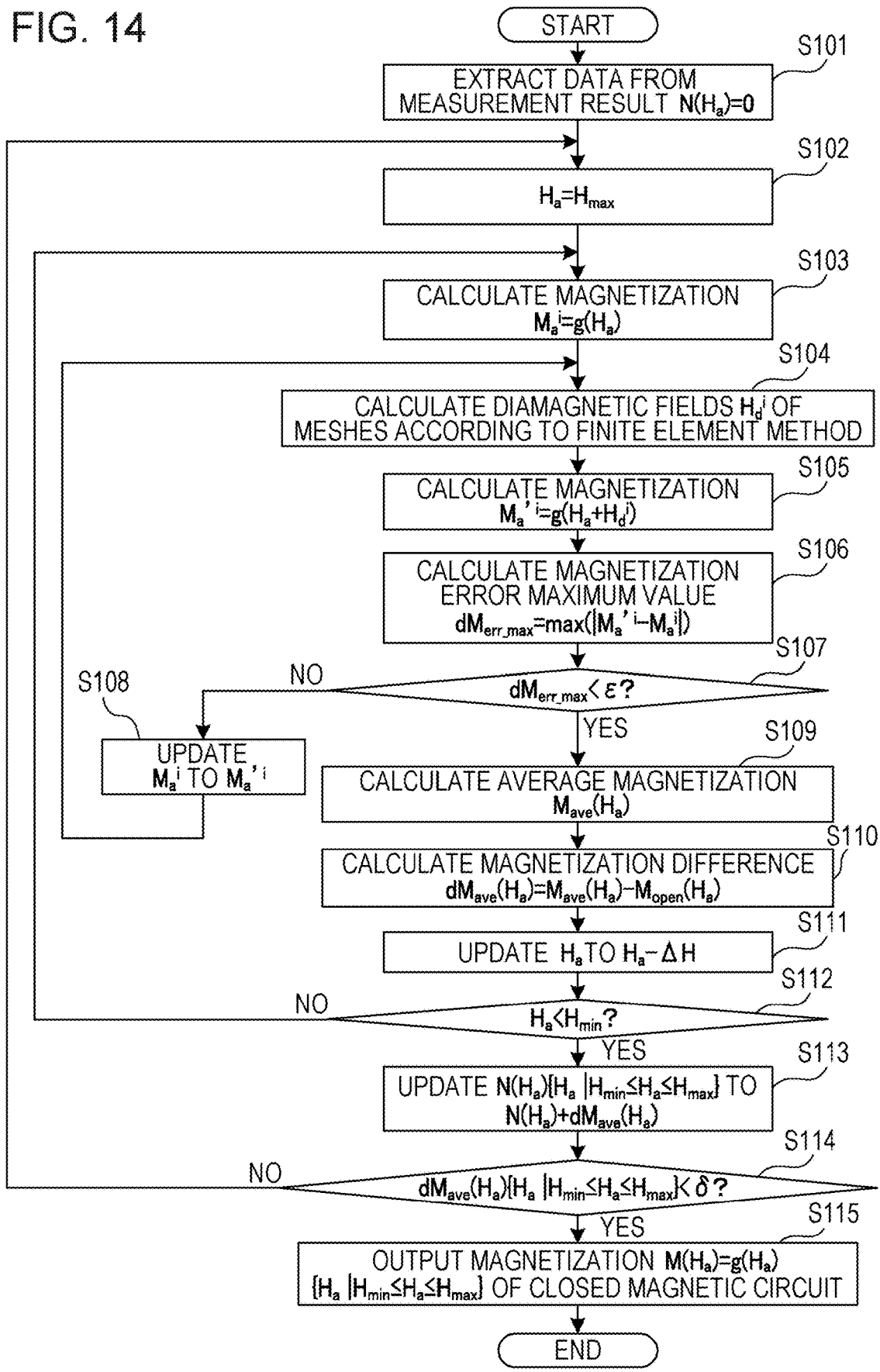
FIG. 14 is a flowchart illustrating an example of a procedure of correction processing.

FIG. 14 is a flowchart illustrating an example of the procedure of the correction processing. The processing illustrated in FIG. 14 is explained below according to step numbers.

Step S101

The closed-magnetic-circuit computing unit 130 extracts data from the measurement result 121 stored in the storing unit 120. For example, the closed-magnetic-circuit computing unit 130 extracts a value of magnetization corresponding to an external magnetic field "0" from the measurement result 121. The closed-magnetic-circuit computing unit 130 stores the extracted magnetization value in the memory 102 as the residual magnetization value $M_r^{open}$. The closed-magnetic-circuit computing unit 130 extracts a value of an external magnetic field corresponding to magnetization "0" from the measurement result 121. The closed-magnetic-circuit computing unit 130 stores the extracted value of the external magnetic field in the memory 102 as the coercive force value $H_c^{open}$. The closed-magnetic-circuit computing unit 130 extracts a maximum value $H_{max}$ of the external magnetic field and a minimum value $H_{min}$ of the external magnetic field from the measurement result 121. The closed-magnetic-circuit computing unit 130 stores the extracted maximum value $H_{max}$ and the extracted minimum value $H_{min}$ in the memory 102.

The closed-magnetic-circuit computing unit 130 sets, as an initial value, "0" in a correction coefficient $N(H_a)$ $\{H_a|H_{min} \leq H_1 \leq H_{max}\}$ in an external magnetic field $H_a$ ($N(H_a)=0$).

Step S102

The closed-magnetic-circuit computing unit 130 sets an initial value of the external magnetic field $H_a$ as the maximum value $H_{max}$.

Step S103

The closed-magnetic-circuit computing unit 130 calculates magnetization $M_a^i$ $\{i|1\leq i \leq n\}$ of each of n meshes based on the external magnetic field $H_a$ and the correction coefficient $N(H_a)$. For example, the closed-magnetic-circuit computing unit 130 calculates $M_a^i = g(H_a)$ for i=1, 2, ..., and n. In $M_a^i = g(H_a)$, $g(H_a)$ is represented by the following expression.

$$g(H_a) = M_r^{open} \times \tanh \frac{H - H_c^{open}}{10^4(1 + N(H_a))} \quad (5)$$

Step S104

The closed-magnetic-circuit computing unit 130 calculates the diamagnetic field $H_d^i$ of each of the meshes based on $M_a^i$ according to the finite element method.

Step S105

The closed-magnetic-circuit computing unit 130 calculates the magnetization $M_a^{\prime i}$ for each of the meshes based on the diamagnetic field $H_d^i$. For example, the closed-magnetic-circuit computing unit 130 calculates $M_a^{\prime i} = g(H_a + H_d^i)$ for i=1, 2, ..., and n. In $M_a^{\prime i} = g(H_a + H_d^i)$, $g(H_a + H_d^i)$ is represented by the following expression.

$$g(H_a + H_d^i) = M_r^{open} \times \tanh \frac{H - H_c^{open}}{10^4(1 + N(H_a + H_d^i))} \quad (6)$$

Step S106

The closed-magnetic-circuit computing unit 130 calculates a magnetization error maximum value $dM_{err\_max}$ among all the meshes based on the magnetization $M_a^{\prime i}$, and the magnetization $M_a^i$. The magnetization error maximum value $dM_{err\_max}$ is represented by an expression "$dM_{err\_max} = \max(|M_a^{\prime i} - M_a^i|) \{i|1\leq i \leq n\}$".

Step S107

The closed-magnetic-circuit computing unit 130 determines whether the magnetization error maximum value $dM_{err\_max}$ is less than the error threshold $\varepsilon$. If the magnetization error maximum value $dM_{err\_max}$ is less than the error threshold $\varepsilon$, the closed-magnetic-circuit computing unit 130 advances the processing to step S109. If the magnetization error maximum value $dM_{err\_max}$ is equal to or more than the error threshold $\varepsilon$, the closed-magnetic-circuit computing unit 130 advances the processing to step S108.

Step S108

The closed-magnetic-circuit computing unit 130 updates a value of $M_a^i$ to a value of $M_a^{\prime i}$ concerning respective i=1, 2, ..., and n. Thereafter, the closed-magnetic-circuit computing unit 130 advances the processing to step S104.

Step S109

The closed-magnetic-circuit computing unit 130 determines that the magnetization $M_a^i$ of each of the meshes where the condition of step S107 is satisfied is a value of magnetization of the mesh reflecting influence of a diamagnetic field in the external magnetic field $H_a$. Therefore, the closed-magnetic-circuit computing unit 130 calculates average magnetization $M_{ave}(H_a)$ of the magnetizations $M_a^i$ of all the meshes. $M_{ave}(H_a)$ is represented by the following expression.

$$M_{ave}(H_a) = \frac{1}{n} \sum_i M_a^i \quad (7)$$

Step S110

The closed-magnetic-circuit computing unit 130 calculates the magnetization difference $dM_{ave}(H_a)$ $\{H_a|H_{min} \leq H_a \leq H_{max}\}$ based on the average magnetization $M_{ave}(H_a)$ and $M_{open}(H_a)$. The magnetization difference is represented by an expression "$dM_{ave}(H_a) = M_{ave}(H_a) - M_{open}(H_a)$".

Step S111

The closed-magnetic-circuit computing unit 130 subtracts a value of the external magnetic field $H_a$ by an interval width $\Delta H$ of the external magnetic field. That is, for example, the closed-magnetic-circuit computing unit 130 updates the value of the external magnetic field $H_a$ to "$H_a - \Delta H$". The interval width $\Delta H$ of the external magnetic field is a preset value. For example, the interval width $\Delta H$ of the external magnetic field is the same as a difference among continuing values of the external magnetic field included in the measurement result 121.

Step S112

The closed-magnetic-circuit computing unit 130 determines whether the value of the external magnetic field $H_a$ is smaller than the minimum value $H_{min}$ of the external magnetic field. If the value of the external magnetic field $H_a$ is smaller than the minimum value $H_{min}$ of the external magnetic field, the closed-magnetic-circuit computing unit 130 advances the processing to step S113. If the value of the external magnetic field $H_a$ is equal to or larger than the minimum value $H_{min}$ of the external magnetic field, the closed-magnetic-circuit computing unit 130 advances the processing to step S103.

Step S113

The closed-magnetic-circuit computing unit 130 corrects the correction coefficient $N(H_a)$ using the magnetization difference $dM_{ave}(H_a)$. Specifically, for example, the closed-magnetic-circuit computing unit 130 sets "$N(H_a) + dM_{ave}(H_a)$" in the correction coefficient $N(H_a)$ $\{H_a|H_{min} \leq H_a \leq H_{max}\}$.

Step S114

The closed-magnetic-circuit computing unit 130 determines whether the magnetization differences $dM_{ave}(H_a)$ $\{H_a|H_{min} \leq H_a \leq H_{max}\}$ concerning all the external magnetic fields $H_a$ are less than the magnetization difference threshold $\delta$. If the magnetization differences $dM_{ave}(H_a)$ concerning all the external magnetic fields $H_a$ are less than the magnetization difference threshold $\delta$, the closed-magnetic-circuit computing unit 130 advances the processing to step S115. If there is at least one external magnetic field $H_a$ in which the magnetization difference $dM_{ave}(H_a)$ is equal to or more than the magnetization difference threshold $\delta$, the closed-magnetic-circuit computing unit 130 advances the processing to step S102.

Step S115

The closed-magnetic-circuit computing unit 130 calculates the magnetizations $M(H_a)$ concerning the respective external magnetic fields $H_a$ $\{H_a|H_{min} \leq H_a \leq H_{max}\}$ based on the correction coefficient $N(H_a)$. For example, the closed-magnetic-circuit computing unit 130 performs calculation of "$M(H_a)=g(H_a)$" based on Expression (1). The closed-magnetic-circuit computing unit 130 outputs the magnetizations $M(H_a)$.

Figure 15:
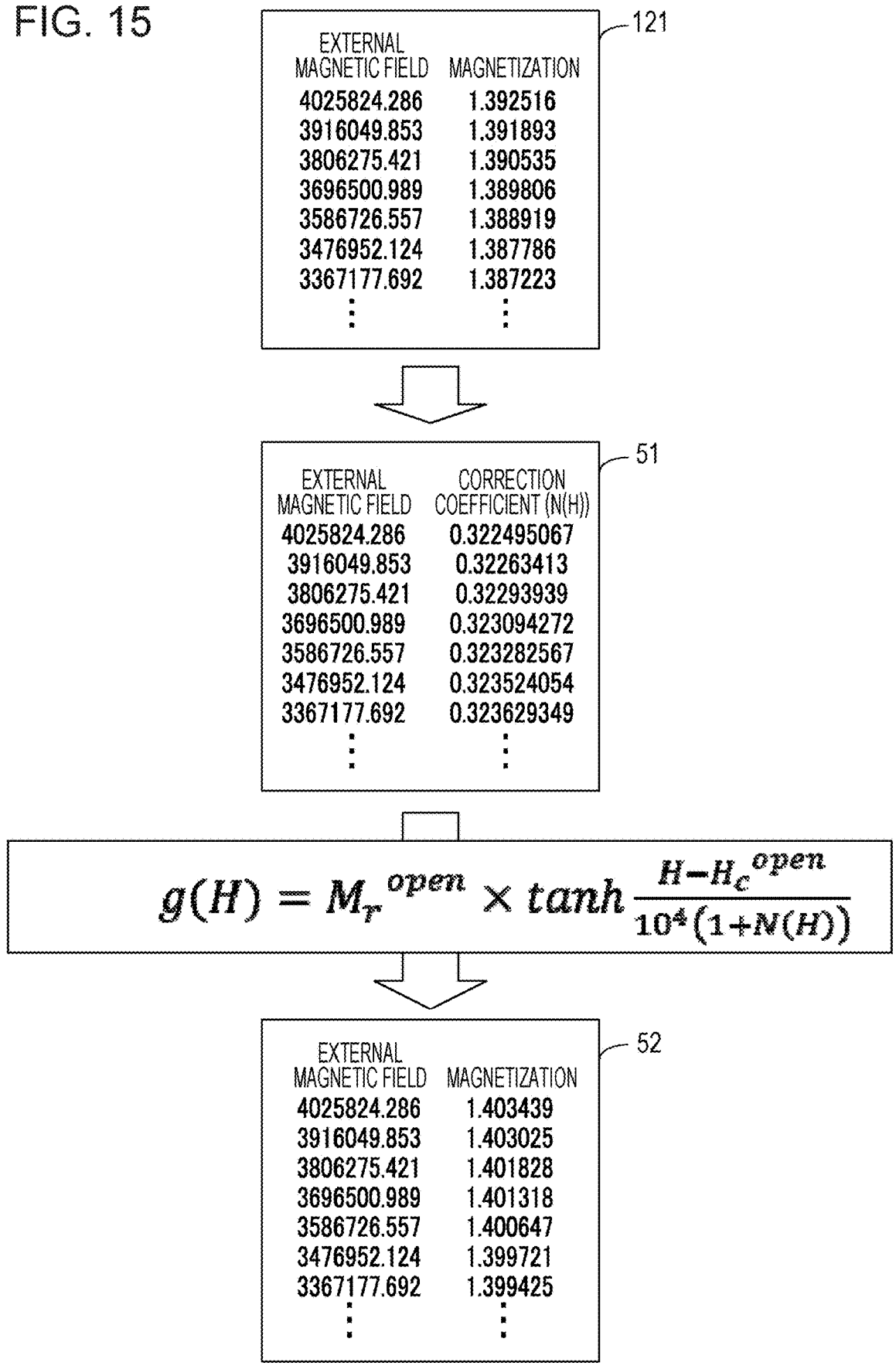
FIG. 15 is a diagram illustrating an example of a calculation result of magnetization based on a correction coefficient.

FIG. 15 is a diagram illustrating an example of a calculation result of the magnetization based on the correction coefficient. As illustrated in FIG. 15, the correction coefficient N(H) is calculated for each of values of the external magnetic field H indicated by the measurement result 121. The calculated correction coefficient is stored in the memory 102 as, for example, correction coefficient information. The closed-magnetic-circuit computing unit 130 calculates a function $g(H_a)$ illustrated in Expression (1) based on correction coefficient information 51 for each of the values of the external magnetic field H indicated by the measurement result 121. The closed-magnetic-circuit computing unit 130 outputs a calculation result of the function $g(H_a)$ as the magnetization $M(H_a)$ for each of the values of the external magnetic field H. For example, the closed-magnetic-circuit computing unit 130 stores the calculated magnetization $M(H_a)$ in the memory 102 as closed magnetic circuit information 52.

In this way, it is possible to calculate an appropriate correction coefficient $N(H_a)$ and calculate the magnetization $M(H_a)$ of a closed magnetic circuit based on the correction coefficient $N(H_a)$. A value of the correction coefficient $N(H_a)$ is different for each of the values of the external magnetic field. Therefore, it is possible to highly accurately correct an open magnetic circuit curve obtained as a measured value to a correct closed magnetic circuit curve. That is, for example, it is possible to obtain a highly accurate closed magnetic circuit curve with the influence of a diamagnetic field excluded based on the measurement result 121 measured in the open magnetic circuit environment.

Figure 16:
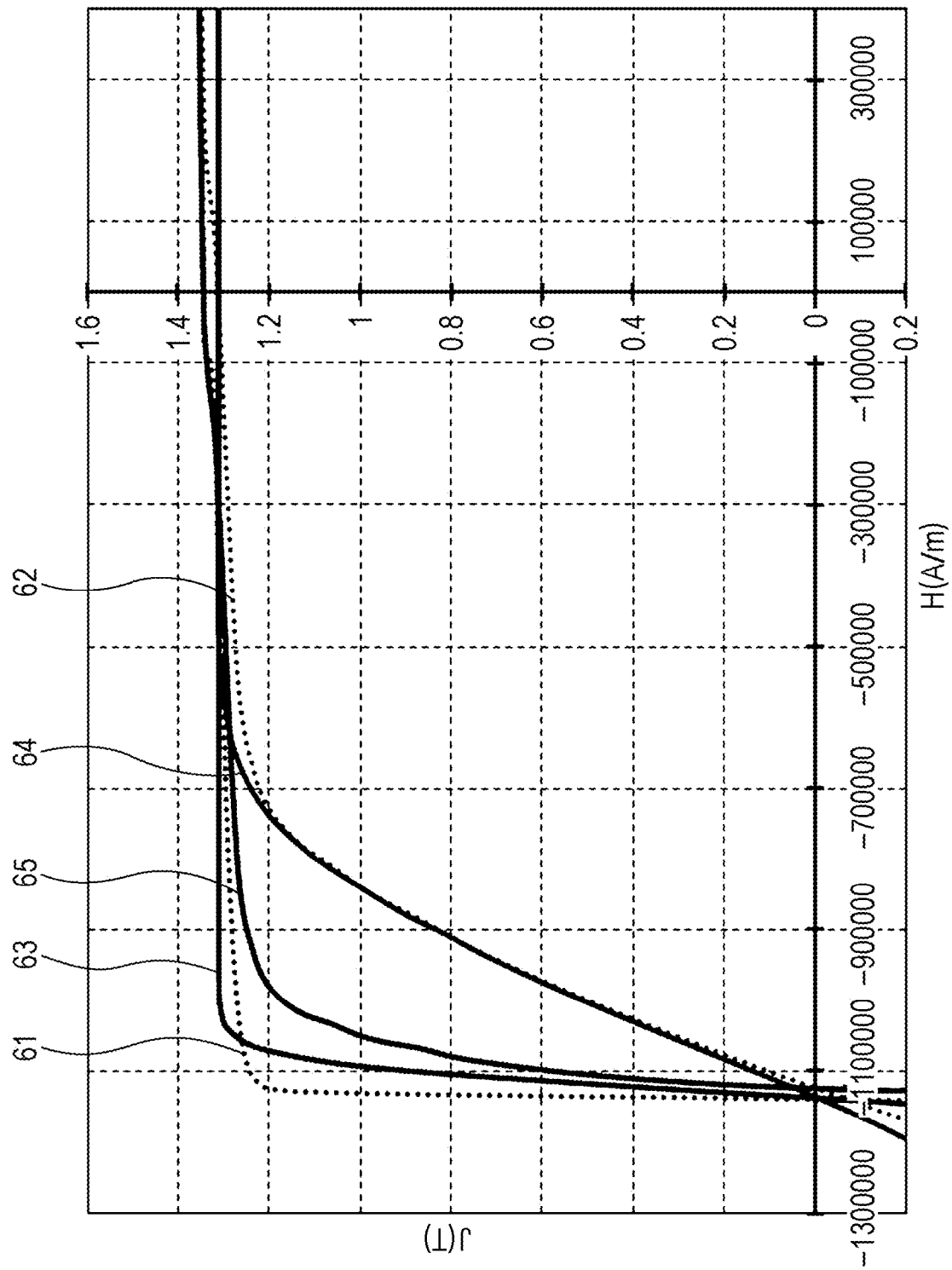
FIG. 16 is a diagram illustrating an example of a calculated closed magnetic circuit curve.

FIG. 16 is a diagram illustrating an example of a calculated closed magnetic circuit curve. FIG. 16 presents a difference between a measured value of a permanent magnet, a magnetic characteristic of which in the closed magnetic circuit environment is measurable, and a closed magnetic circuit curve of the permanent magnet calculated from a measurement result in the open magnetic circuit environment by a closed magnetic circuit computing method explained in the second embodiment. In FIG. 16, a closed magnetic circuit curve 61 obtained by measurement and an open magnetic circuit curve 62 obtained by measurement are indicated by dotted lines. A closed magnetic circuit curve 63 calculated by the closed magnetic circuit computing method explained in the second embodiment and an open magnetic circuit curve 64 calculated by reflecting the influence of a diamagnetic field on the closed magnetic circuit curve 63 are indicated by solid lines. In FIG. 16, as a comparative example, a closed magnetic circuit curve 65 calculated by correcting, with a fixed value of the correction coefficient N=1/3.791, the open magnetic circuit curve 62 obtained from a measured value is indicated by a solid line.

As illustrated in FIG. 16, the closed magnetic circuit curve 63 calculated by the closed magnetic circuit computing method explained in the second embodiment has a shape similar to the closed magnetic circuit curve 61 obtained by measurement compared with the closed magnetic circuit curve 65 calculated when the correction coefficient is the fixed value. Consequently, it is seen that calculation accuracy of a magnetic characteristic is improved.

If the highly accurate closed magnetic circuit curve 63 is obtained, it is possible to correctly grasp a magnetic characteristic of the permanent magnet 41. The computer 100 displays a state of magnetization of the permanent magnet 41 corresponding to the external magnetic field on the monitor 21 with, for example, a contour diagram (an isoplethic curve).

Figure 17:
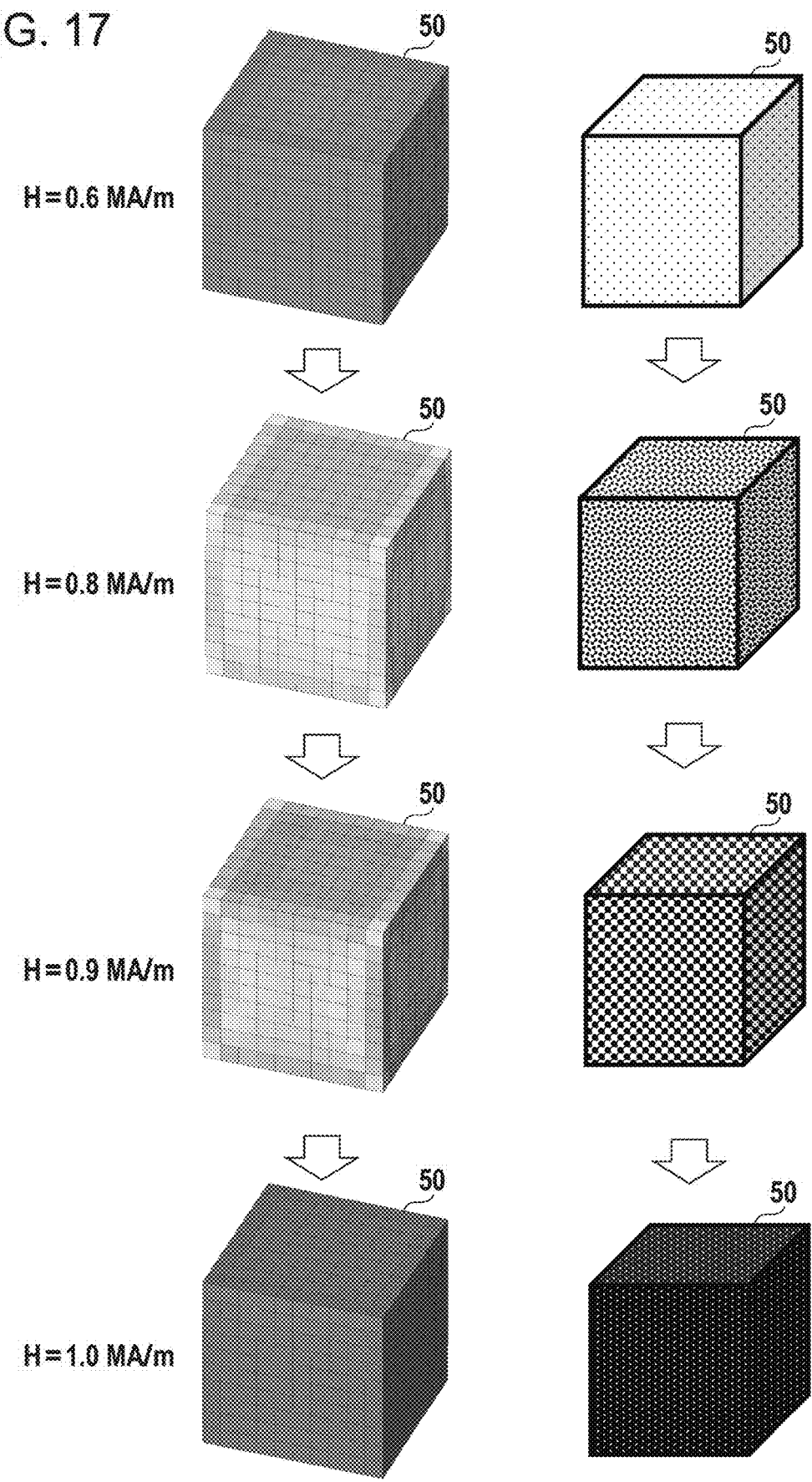
FIG. 17 is a diagram illustrating an example of a contour diagram illustrating a state of magnetization.

FIG. 17 is a diagram illustrating an example of a contour diagram illustrating a state of magnetization and a schematic diagram corresponding to the contour diagram. In the example illustrated in FIG. 17, the mesh model 50 of the permanent magnet 41 is displayed in colors corresponding to degrees of magnetization. For example, the computer 100 displays a region with a lower value of magnetization in a lighter color and displays a region with a higher value of magnetization in a darker color.

In this way, a magnetization characteristic of the permanent magnet 41, in which the influence of a diamagnetic field is removed, is accurately seen based on a measurement result of the magnetization in the open magnetic circuit environment. Therefore, it is possible to accurately learn a magnetic characteristic of a strong magnet such as a neodymium magnet. Consequently, it is easy to design a high-performance motor. For example, by calculating a magnetic force generated in a motor using the computer 100, it is possible to calculate performance of the motor.

Figure 18:
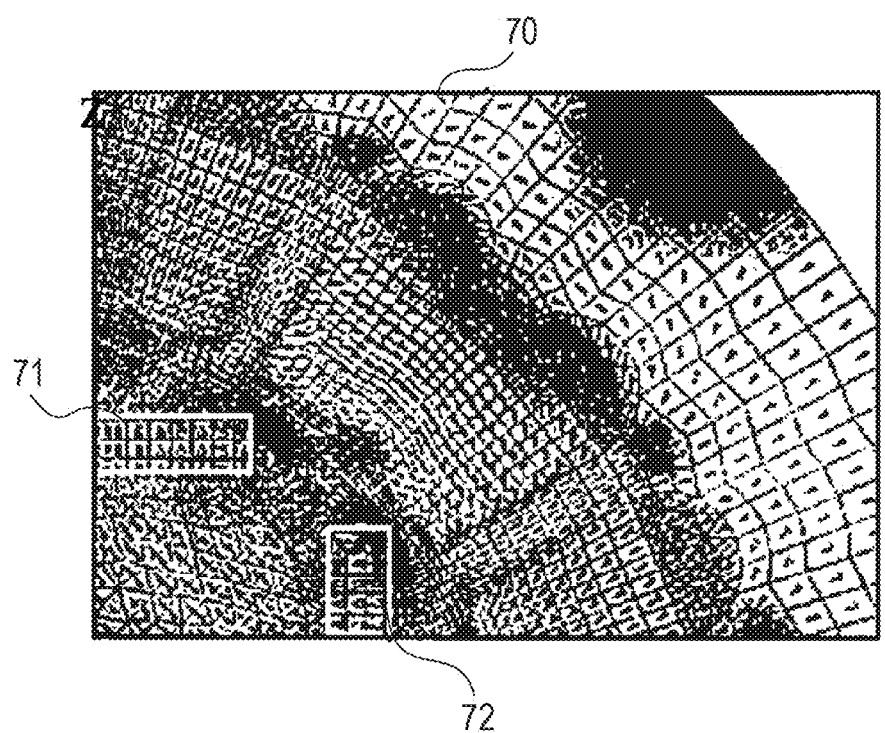
FIG. 18 is a diagram illustrating an example of a calculation result of magnetization in a motor.

FIG. 18 is a diagram illustrating an example of a calculation result of a magnetic force in a motor. FIG. 18 is a contour diagram in which regions around permanent magnets 71 and 72 in a motor 70 are color-coded and displayed according to magnetic forces. In this way, it is possible to perform evaluation of performance obtained when a strong permanent magnet is used in the motor 70. It is easy to design a high-performance motor 70.

Other Embodiments

In the second embodiment, an end condition (a determination condition in step S107) for the repeated processing of the magnetization calculation for each of the meshes is that the magnetization error maximum value $dM_{err\_max}$ is less than the error threshold $\varepsilon$. However, another end condition may be applied. For example, if the average of the magnetization of the meshes is less than the error threshold $\varepsilon$, the closed-magnetic-circuit computing unit 130 may determine to end the repeated processing of the magnetization calculation (YES in step S107).

In the second embodiment, an end condition (a determination condition in step S114) for the repeated processing of the correction coefficient update is that the magnetization difference $dM_{ave}(H_a)$ is less than the threshold $\delta$ in all the external magnetic fields. However, another end condition may be applied. For example, if the average of the magnetization differences $dM_{ave}(H_a)$ corresponding to the external magnetic fields is less than the threshold $\delta$, the closed-magnetic-circuit computing unit 130 may determine to end the repeated processing of the correction coefficient update (YES in step S114).

The embodiments are illustrated above. However, the components of the units explained in the embodiments may be replaced with components having the same functions. Any other components and steps may be added. Any two or more components (characteristics) in the embodiments may be combined.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An information processing device comprising:
    a memory configured to store a measurement result of a first magnetization of a permanent magnet corresponding to an external magnetic field in an open magnetic circuit environment; and
    a processor configured to:
        divide the permanent magnet into a plurality of meshes, generate a function based on the measurement result, the function indicating a second magnetization corresponding to the external magnetic field in a closed magnetic circuit environment, the function including a parameter having a value corresponding to the external magnetic field,
        calculate the second magnetization corresponding to the external magnetic field based on the function for each of the meshes, calculate a diamagnetic field corresponding to the external magnetic field based on the second magnetization for each of the meshes,
        calculate, for each of the meshes based on the function, a third magnetization of the permanent magnet corresponding to the external magnetic field in the open magnetic circuit environment in a state where influence of the diamagnetic field is applied to the external magnetic field,
        calculate an average of the third magnetizations of the meshes corresponding to the external magnetic field,
        calculate an error between the first magnetization indicated by the measurement result and the calculated average of the third magnetizations,
        correct the value of the parameter corresponding to the external magnetic field based on the error, and
        repeat the calculation of the second magnetization, the calculation of the diamagnetic field, the calculation of the third magnetizations, the calculation of the average, the calculation of the error, and the correction of the value of the parameter until the error falls below a threshold.

2. The information processing device according to claim 1, wherein, when the error falls below the threshold, the processor further outputs the second magnetization corresponding to the external magnetic field calculated based on the function after the correction of the value of the parameter.

3. The information processing device according to claim 1, wherein, in the calculation of the third magnetization, for each of the meshes, the processor sets the second magnetization as an initial value of a provisional third magnetization, repeats calculation of the diamagnetic field based on the provisional third magnetization and update of the provisional third magnetization to a magnetization corresponding to the external magnetic field and the diamagnetic field based on the function until a difference between the pre-update provisional third magnetization and the post-update provisional third magnetization falls below the threshold of the error, and sets, as the third magnetization, the provisional third magnetization where the difference between the pre-update provisional third magnetization and the post-update provisional third magnetization falls below the threshold of the error.

4. The information processing device according to claim 1, wherein, in the generation of the function, the processor generates the function with which a value of the second magnetization in a state where the external magnetic field is 0 equals to a value of the first magnetization in a state where the external magnetic field in the measurement result is 0 and a value of the external magnetic field in which the second magnetization is 0 equals to a value of the external magnetic field in which the first magnetization in the measurement result is 0.

5. The information processing device according to claim 1, wherein the function is a hyperbolic tangent function.

6. A non-transitory computer-readable recording medium storing therein a program for causing a computer to execute a process, the process comprising:
    storing a measurement result of a first magnetization of a permanent magnet corresponding to an external magnetic field in an open magnetic circuit environment; and
    dividing the permanent magnet into a plurality of meshes, generating a function based on the measurement result, the function indicating a second magnetization corresponding to the external magnetic field in a closed magnetic circuit environment, the function including a parameter having a value corresponding to the external magnetic field,
    calculating the second magnetization corresponding to the external magnetic field based on the function for each of the meshes, calculating a diamagnetic field corresponding to the external magnetic field based on the second magnetization for each of the meshes,
    calculating, for each of the meshes based on the function, a third magnetization of the permanent magnet corresponding to the external magnetic field in the open magnetic circuit environment in a state where influence of the diamagnetic field is applied to the external magnetic field,
    calculating an average of the third magnetizations of the meshes corresponding to the external magnetic field,
    calculating an error between the first magnetization indicated by the measurement result and the calculated average of the third magnetizations,
    correcting the value of the parameter corresponding to the external magnetic field based on the error, and
    repeating the calculation of the second magnetization, the calculation of the diamagnetic field, the calculation of the third magnetizations, the calculation of the average, the calculation of the error, and the correction of the value of the parameter until the error falls below a threshold.

7. A closed magnetic circuit computing system comprising:
    a memory;
    a magnetic field sensor;
    a controller configured to measure a first magnetization of a permanent magnet corresponding to an external magnetic in an open magnetic circuit environment by using the magnetic field sensor;
    a processor coupled to the memory and the processor configured to:
        store a measurement result of the first magnetization in the memory, divide the permanent magnet into a plurality of meshes,
generate a function based on the measurement result, the function indicating a second magnetization corresponding to the external magnetic field in a closed magnetic circuit environment, the function including a parameter having a value corresponding to the external magnetic field,
calculate the second magnetization corresponding to the external magnetic field based on the function for each of the meshes, calculate a diamagnetic field corresponding to the external magnetic field based on the second magnetization for each of the meshes,
calculate, for each of the meshes based on the function, a third magnetization of the permanent magnet corresponding to the external magnetic field in the open magnetic circuit environment in a state where influence of the diamagnetic field is applied to the external magnetic field,
calculate an average of the third magnetizations of the meshes corresponding to the external magnetic field,
calculate an error between the first magnetization indicated by the measurement result and the calculated average of the third magnetizations,
correct the value of the parameter corresponding to the external magnetic field based on the error, and
repeat the calculation of the second magnetization, the calculation of the diamagnetic field, the calculation of the third magnetizations, the calculation of the average, the calculation of the error, and the correction of the value of the parameter until the error falls below a threshold.

* * * * *